United States Patent
Anagawa et al.

(10) Patent No.: US 10,386,170 B2
(45) Date of Patent: Aug. 20, 2019

(54) ANGLE SENSOR AND ANGLE SENSOR SYSTEM

(71) Applicant: TDK CORPORATION, Tokyo (JP)

(72) Inventors: Kenkichi Anagawa, Tokyo (JP); Shinichirou Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/875,166

(22) Filed: Jan. 19, 2018

(65) Prior Publication Data

US 2018/0274896 A1 Sep. 27, 2018

(30) Foreign Application Priority Data

Mar. 22, 2017 (JP) ................................ 2017-055324

(51) Int. Cl.
| | |
|---|---|
| *G01B 7/30* | (2006.01) |
| *G01D 5/16* | (2006.01) |
| *G01R 33/09* | (2006.01) |
| *G01D 3/02* | (2006.01) |
| *G01D 5/14* | (2006.01) |
| *G01D 5/244* | (2006.01) |

(52) U.S. Cl.
CPC ............... *G01B 7/30* (2013.01); *G01D 3/02* (2013.01); *G01D 5/145* (2013.01); *G01D 5/16* (2013.01); *G01D 5/24476* (2013.01); *G01R 33/09* (2013.01); *G01R 33/093* (2013.01)

(58) Field of Classification Search
CPC ........ G01B 7/30; G01D 3/02; G01D 5/24476; G01D 5/145; G01D 5/16; G01R 33/09
USPC ................. 324/207.21, 207.13, 207.11, 200
See application file for complete search history.

(56) References Cited

U.S. PATENT DOCUMENTS

| | | | |
|---|---|---|---|
| 6,603,306 B1 * | 8/2003 | Olsson | H03K 17/945 324/207.17 |
| 8,604,780 B2 | 12/2013 | Saruki et al. | |

(Continued)

FOREIGN PATENT DOCUMENTS

| | | |
|---|---|---|
| DE | 10 2012 204 634 A1 | 9/2013 |
| DE | 10 2014 116 826 A1 | 5/2015 |

(Continued)

OTHER PUBLICATIONS

May 25, 2018 Office Action issued in German Patent Application No. 10 2018 101 909.2.

*Primary Examiner* — Giovanni Astacio-Oquendo
(74) *Attorney, Agent, or Firm* — Oliff PLC

(57) ABSTRACT

An angle sensor includes detection units and an angle computation unit. The detection units detect a composite magnetic field of a magnetic field to be detected and a noise magnetic field. Each detection unit generates a first detection signal representing the strength of a component in a first direction of the composite magnetic field, and a second detection signal representing the strength of a component in a second direction of the composite magnetic field. The angle computation unit generates a detected angle value by performing computations using a plurality of pairs of first and second detection signals generated at the detection units wherein an error of the detected angle value resulting from the noise magnetic field is made smaller than in the case of generating the detected angle value on the basis of only a pair of first and second detection signals generated at any one of the detection units.

8 Claims, 10 Drawing Sheets

(56) References Cited

U.S. PATENT DOCUMENTS

| | | | |
|---|---|---|---|
| 8,659,289 B2 | 2/2014 | Saruki et al. | |
| 2001/0052771 A1* | 12/2001 | Jagiella | F15B 15/2846 324/207.16 |
| 2007/0205736 A1 | 9/2007 | Lindberg et al. | |
| 2009/0203269 A1* | 8/2009 | Jenne | G01D 11/245 439/862 |
| 2014/0160597 A1* | 6/2014 | Ota | G11B 5/1278 360/234.3 |
| 2014/0177104 A1* | 6/2014 | Ukita | G11B 5/1278 360/236.5 |
| 2015/0025761 A1 | 1/2015 | Kernebeck | |
| 2015/0142376 A1 | 5/2015 | Ausserlechner | |
| 2017/0030742 A1* | 2/2017 | Mochizuki | G01D 5/145 |
| 2017/0248445 A1 | 8/2017 | Ausserlechner | |
| 2018/0164127 A1* | 6/2018 | Anagawa | G01D 3/036 |

FOREIGN PATENT DOCUMENTS

| | | |
|---|---|---|
| DE | 10 2016 103 325 A1 | 8/2017 |
| EP | 1 464 918 A2 | 10/2004 |
| WO | 2007/092402 A2 | 8/2007 |

* cited by examiner

ANGLE SENSOR AND ANGLE SENSOR SYSTEM

BACKGROUND OF THE INVENTION

Field of the Invention

The present invention relates to an angle sensor and an angle sensor system for generating a detected angle value having a correspondence with an angle to be detected.

Description of the Related Art

In recent years, angle sensors have been widely used in various applications, such as detection of the rotational position of a steering wheel or a power steering motor in an automobile. The angle sensors generate a detected angle value having a correspondence with an angle to be detected. Examples of the angle sensors include a magnetic angle sensor. An angle sensor system using a magnetic angle sensor is typically provided with a magnetic field generation unit for generating a magnetic field to be detected, the direction of which rotates in response to the rotation or linear movement of an object. The magnetic field generation unit is a magnet, for example. The angle to be detected by the magnetic angle sensor has a correspondence with an angle that the direction of the magnetic field to be detected at a reference position forms with respect to a reference direction.

Among known magnetic angle sensors is one that includes a plurality of detection circuits for generating a plurality of detection signals of different phases and generates a detected angle value by performing computations using the plurality of detection signals, as disclosed in U.S. Pat. Nos. 8,604,780 B2 and 8,659,289 B2. Each of the plurality of detection circuits detects a magnetic field to be detected. Each of the plurality of detection circuits includes at least one magnetic detection element.

In some magnetic angle sensors, as described in U.S. Pat. Nos. 8,604,780 B2 and 8,659,289 B2, each detection circuit may be subjected to not only a magnetic field to be detected but also a noise magnetic field other than the magnetic field to be detected. Examples of the noise magnetic field include the earth's magnetic field and a leakage magnetic field from a motor. When subjected to such a noise magnetic field, each detection circuit detects a composite magnetic field of the magnetic field to be detected and the noise magnetic field. When the magnetic field to be detected and the noise magnetic field are in different directions, some error occurs in the detected angle value. The error occurring in the detected angle value will hereinafter be referred to as angular error.

U.S. Pat. Nos. 8,604,780 B2 and 8,659,289 B2 describe rotating field sensors that are capable of reducing the angular error caused by the noise magnetic field. Each of the rotating field sensors described in U.S. Pat. Nos. 8,604,780 B2 and 8,659,289 B2 is provided with a magnetic field generation unit for generating a rotating magnetic field, and a first and a second detection unit. The rotating magnetic field includes a first partial magnetic field present at a first position and a second partial magnetic field present at a second position. The first partial magnetic field and the second partial magnetic field are in directions different from each other by 180°, and rotate in the same rotational direction. The first detection unit is configured to detect, at the first position, a composite magnetic field of the first partial magnetic field and the noise magnetic field. The second detection unit is configured to detect, at the second position, a composite magnetic field of the second partial magnetic field and the noise magnetic field. The rotating field sensors described in U.S. Pat. Nos. 8,604,780 B2 and 8,659,289 B2 perform computations using the outputs from the first and second detection units to thereby generate a detected angle value in which the angular error caused by the noise magnetic field is reduced.

The rotating field sensors described in U.S. Pat. Nos. 8,604,780 B2 and 8,659,289 B2 each require the particular magnetic field generation unit for generating a rotating magnetic field that includes the first and second partial magnetic fields defined as above. Furthermore, locations of the first and second detection units are limited depending on the pattern of the rotating magnetic field. These rotating field sensors thus have substantial limitations with respect to structure and installation.

SUMMARY OF THE INVENTION

It is an object of the present invention to provide an angle sensor and an angle sensor system that enable reduction of an angular error caused by a noise magnetic field, without introducing any substantial limitations with respect to structure or installation.

An angle sensor of the present invention is configured to generate a detected angle value having a correspondence with an angle to be detected. The angle sensor of the present invention includes a plurality of detection units and an angle computation unit. The plurality of detection units are configured to detect, at a plurality of detection positions different from each other, a composite magnetic field of a magnetic field to be detected and a noise magnetic field other than the magnetic field to be detected. The angle computation unit is configured to generate the detected angle value.

At each of the plurality of detection positions, the magnetic field to be detected varies in direction according to the angle to be detected. The magnetic field to be detected has different strengths at the plurality of detection positions. Each of the plurality of detection units includes a first detection signal generation unit for generating a first detection signal representing the strength of a component in a first direction of the composite magnetic field, and a second detection signal generation unit for generating a second detection signal representing the strength of a component in a second direction of the composite magnetic field.

The angle computation unit generates the detected angle value by performing computations using a plurality of pairs of first and second detection signals generated at the plurality of detection units so that an error of the detected angle value resulting from the noise magnetic field is made smaller than in the case of generating the detected angle value on the basis of only a pair of first and second detection signals generated at any one of the plurality of detection units.

In the angle sensor of the present invention, the first direction and the second direction may be orthogonal to each other. Each of the first and second detection signal generation units may include at least one magnetic detection element.

In the angle sensor of the present invention, the plurality of detection units may be a first detection unit and a second detection unit. In such a case, the angle computation unit may generate the detected angle value using a difference between the first detection signal generated at the first detection unit and the first detection signal generated at the second detection unit, and a difference between the second detection signal generated at the first detection unit and the second detection signal generated at the second detection unit.

In the angle sensor of the present invention, the angle computation unit may generate the detected angle value using the method of least squares on the basis of the plurality of pairs of first and second detection signals. In such a case, the angle computation unit may assume first unknown magnetic field information, second unknown magnetic field information, a plurality of first assumed detection values, a plurality of second assumed detection values, a plurality of first residuals, and a plurality of second residuals. The first unknown magnetic field information corresponds to strengths, at a predetermined position, of a component in the first direction and a component in the second direction of the magnetic field to be detected. The second unknown magnetic field information corresponds to strengths of a component in the first direction and a component in the second direction of the noise magnetic field. Each of the plurality of first assumed detection values is a value that corresponds to one of the first detection signals generated at the plurality of detection units and is assumed on the basis of the first and second unknown magnetic field information. Each of the plurality of second assumed detection value is a value that corresponds to one of the second detection signals generated at the plurality of detection units and is assumed on the basis of the first and second unknown magnetic field information. Each of the plurality of first residuals is a difference between one of the first detection signals generated at the plurality of detection units and a corresponding one of the first assumed detection values. Each of the plurality of second residuals is a difference between one of the second detection signals generated at the plurality of detection units and a corresponding one of the second assumed detection values. The angle computation unit may then estimate the first and second unknown magnetic field information so as to minimize the sum of squares of the plurality of first residuals and to minimize the sum of squares of the plurality of second residuals, and may determine the detected angle value on the basis of the estimated first unknown magnetic field information. Further, the angle computation unit may perform computations to determine the detected angle value using a plurality of composite detection signals and a plurality of composite assumed detection values. Each of the plurality of composite detection signals is a complex number representing a pair of first and second detection signals generated at one of the plurality of detection units. Each of the plurality of composite assumed detection values is a complex number representing a pair of first and second assumed detection values corresponding to the pair of first and second detection signals.

An angle sensor system of the present invention includes the angle sensor of the present invention and a magnetic field generation unit for generating the magnetic field to be detected.

According to the angle sensor and the angle sensor system of the present invention, a plurality of pairs of first and second detection signals generated at a plurality of detection units are used to perform computations to generate a detected angle value. This allows the detected angle value to contain a smaller angular error caused by the noise magnetic field than in the case of generating the detected angle value on the basis of only a pair of first and second detection signals generated at any one of the plurality of detection units. The present invention has to satisfy the condition that a magnetic field to be detected has different strengths at a plurality of detection positions; however, this condition introduces no substantial limitations with respect to the structure or installation of the angle sensor or the angle sensor system. The present invention thus enables reduction of the angular error caused by the noise magnetic field, without introducing any substantial limitations with respect to the structure or installation of the angle sensor or the angle sensor system.

Other and further objects, features and advantages of the present invention will appear more fully from the following description.

DETAILED DESCRIPTION OF THE PREFERRED EMBODIMENTS

First Embodiment

Figure 1:
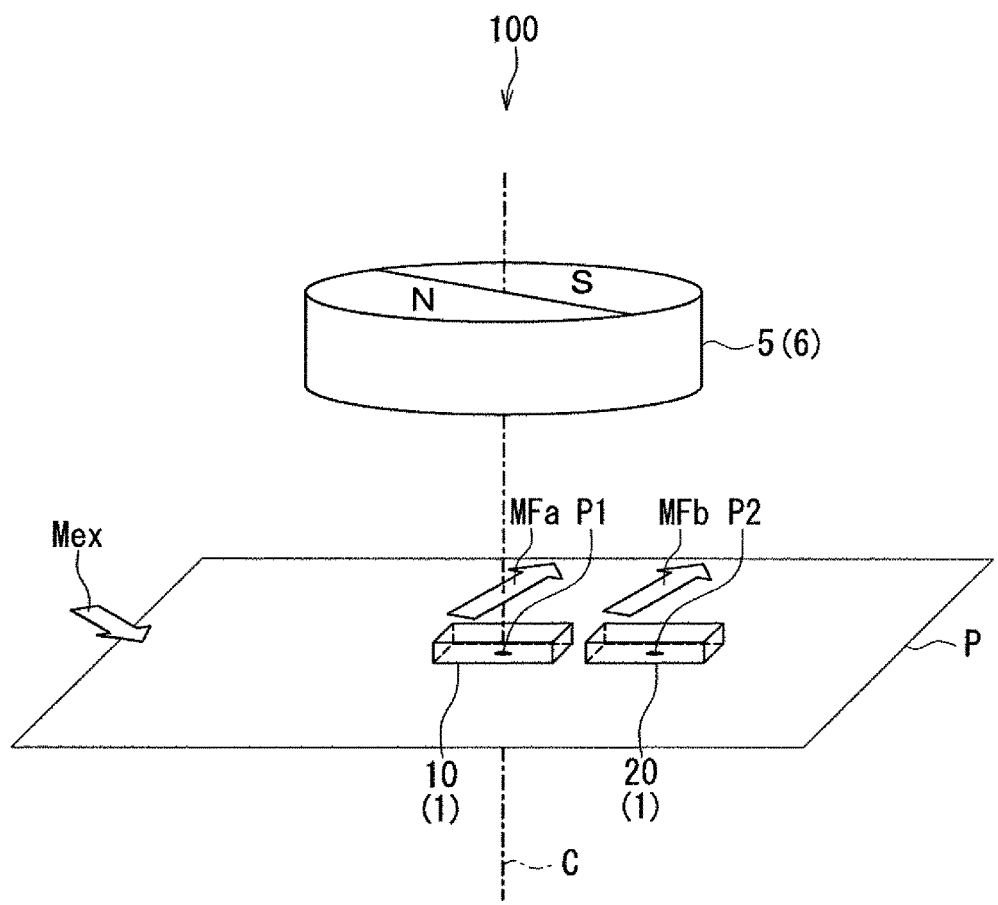
FIG. 1 is a perspective view illustrating the general configuration of an angle sensor system according to a first embodiment of the invention.

Preferred embodiments of the present invention will now be described in detail with reference to the drawings. First, reference is made to FIG. 1 to describe the general configuration of an angle sensor system according to a first embodiment of the invention. The angle sensor system 100 according to the first embodiment includes an angle sensor 1 according to the first embodiment and a magnetic field generation unit 5.

The angle sensor 1 is a magnetic angle sensor, in particular. The magnetic field generation unit 5 generates a magnetic field to be detected, which is an original magnetic field that the angle sensor 1 should detect.

The magnetic field generation unit 5 of the present embodiment is a magnet 6 of a cylindrical shape. The magnet 6 has an N pole and an S pole that are arranged symmetrically with respect to an imaginary plane including the central axis of the cylindrical shape. The magnet 6 rotates about the central axis of the cylindrical shape. Consequently, the direction of the magnetic field to be detected generated by the magnet 6 rotates about a center of rotation C including the central axis of the cylindrical shape.

The angle sensor 1 is configured to generate a detected angle value $\theta s$ having a correspondence with an angle to be detected. In the present embodiment, the angle to be detected has a correspondence with an angle that the direction of the magnetic field to be detected at a reference position forms with respect to a reference direction. Hereinafter, the angle that the direction of the magnetic field to be detected at the reference position forms with respect to the reference direction will be referred to as rotating field angle, and denoted by the symbol $\theta M$. In the present embodiment, the rotating field angle $\theta M$ is assumed to be equal to the angle to be detected.

The reference position is located within a reference plane P. As used herein, the reference plane P refers to an imaginary plane parallel to an end face of the magnet 6. In the reference plane P, the direction of the magnetic field to be detected generated by the magnet 6 rotates about the reference position. The reference direction is located within the reference plane P and intersects the reference position. In the following description, the direction of the magnetic field to be detected at the reference position refers to a direction in the reference plane P.

The angle sensor 1 includes a plurality of detection units. The plurality of detection units detect, at a plurality of detection positions different from each other, a composite magnetic field of the magnetic field to be detected and a noise magnetic field other than the magnetic field to be detected. At each of the plurality of detection positions, the direction of the magnetic field to be detected varies according to the angle to be detected and the rotating field angle $\theta M$. The magnetic field to be detected has different strengths at the plurality of detection positions.

The number of the plurality of detection positions is at least two. The following description deals with a case where the plurality of detection positions are a first detection position P1 and a second detection position P2, and the plurality of detection units are a first detection unit 10 and a second detection unit 20. The first detection unit 10 detects the composite magnetic field at the first detection position P1. The second detection unit 20 detects the composite magnetic field at the second detection position P2.

In the present embodiment, the first and second detection positions P1 and P2 are located in the reference plane P. In the present embodiment, in particular, the first and second detection positions P1 and P2 are defined to be at different distances from the point of intersection of the reference plane P and the center of rotation C. The positional relationship between the magnet 6 and the first and second detection positions P1 and P2 is not limited to the example shown in FIG. 1. For example, the first and second detection positions P1 and P2 may be two positions located at different distances from the magnet 6.

Hereinafter, the magnetic field to be detected at the first detection position P1 will be referred to as the first partial magnetic field MFa, and the magnetic field to be detected at the second detection position P2 will be referred to as the second partial magnetic field MFb. The directions of the first and second partial magnetic fields MFa and MFb vary according to the angle to be detected and the rotating field angle $\theta M$. Since the first and second detection positions P1 and P2 are different from each other, the strengths of the first and second partial magnetic fields MFa and MFb are different from each other.

The direction and the strength of the noise magnetic field at the second detection position P2 are respectively the same as the direction and the strength of the noise magnetic field at the first detection position P1. The noise magnetic field will be denoted by the symbol Mex. The noise magnetic field Mex may be a magnetic field whose direction and strength are temporally constant, a magnetic field whose direction and strength temporally vary in a periodic manner, or a magnetic field whose direction and strength temporally vary in a random fashion.

The composite magnetic field at the first detection position P1 will be referred to as the first composite magnetic field MF1, and the composite magnetic field at the second detection position P2 will be referred to as the second composite magnetic field MF2. The first composite magnetic field MF1 is a composite magnetic field of the first partial magnetic field MFa and the noise magnetic field Mex. The second composite magnetic field MF2 is a composite magnetic field of the second partial magnetic field MFb and the noise magnetic field Mex.

Definitions of directions and angles used in the present embodiment will now be described with reference to FIG. 1 and FIG. 2. First, Z direction is the direction parallel to the center of rotation C shown in FIG. 1 and upward in FIG. 1. FIG. 2 illustrates the Z direction as the direction out of the plane of FIG. 2. Next, X and Y directions are two directions that are perpendicular to the Z direction and orthogonal to each other. FIG. 2 illustrates the X direction as the rightward direction, and the Y direction as the upward direction. Further, −X direction is the direction opposite to the X direction, and −Y direction is the direction opposite to the Y direction.

The rotating field angle $\theta M$ is expressed with respect to the reference direction DR. In the present embodiment, the reference direction DR is the X direction. Further, in the present embodiment the reference position is the point of intersection of the reference plane P and the center of rotation C.

Assume that the directions of the first and second composite magnetic fields MF1 and MF2 both rotate counterclockwise in FIG. 2. As shown in FIG. 2, $\theta 1$ represents an angle that the direction of the first composite magnetic field MF1 forms with respect to the reference direction DR, and $\theta 2$ represents an angle that the direction of the second composite magnetic field MF2 forms with respect to the reference direction DR. The angles $\theta 1$ and $\theta 2$ are expressed in positive values when seen counterclockwise from the reference direction DR, and in negative values when seen clockwise from the reference direction DR.

The main component of the first composite magnetic field MF1 is the first partial magnetic field MFa. The main component of the second composite magnetic field MF2 is the second partial magnetic field MFb. In the present embodiment, the direction of each of the first and second partial magnetic fields MFa and MFb is assumed to be the same as the direction of the magnetic field to be detected at the reference position. In this case, the angle that each of the first and second partial magnetic fields MFa and MFb forms with respect to the reference direction DR is equal to the rotating field angle θM. The positive and negative signs of the aforementioned angle are defined in the same manner as those of the angles θ1 and θ2.

Figure 2:
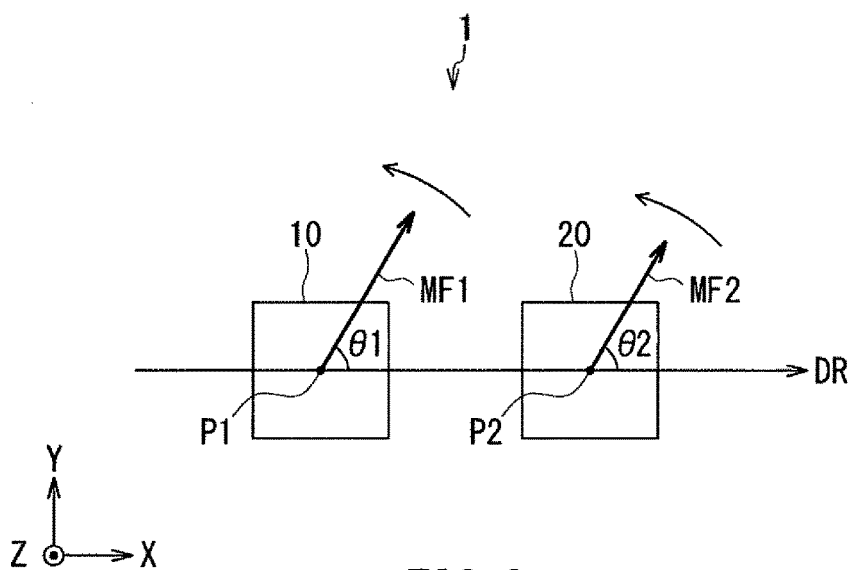
FIG. 2 is an explanatory diagram illustrating the definitions of directions and angles used in the first embodiment of the invention.

FIG. 1 illustrates an example in which the reference position and the first detection position P1 are identical. As far as the above-described relationships between the first and second partial magnetic fields MFa and MFb and the magnetic field to be detected at the reference position are satisfied, the reference position may be different from the point of intersection of the reference plane P and the center of rotation C.

Figure 3:
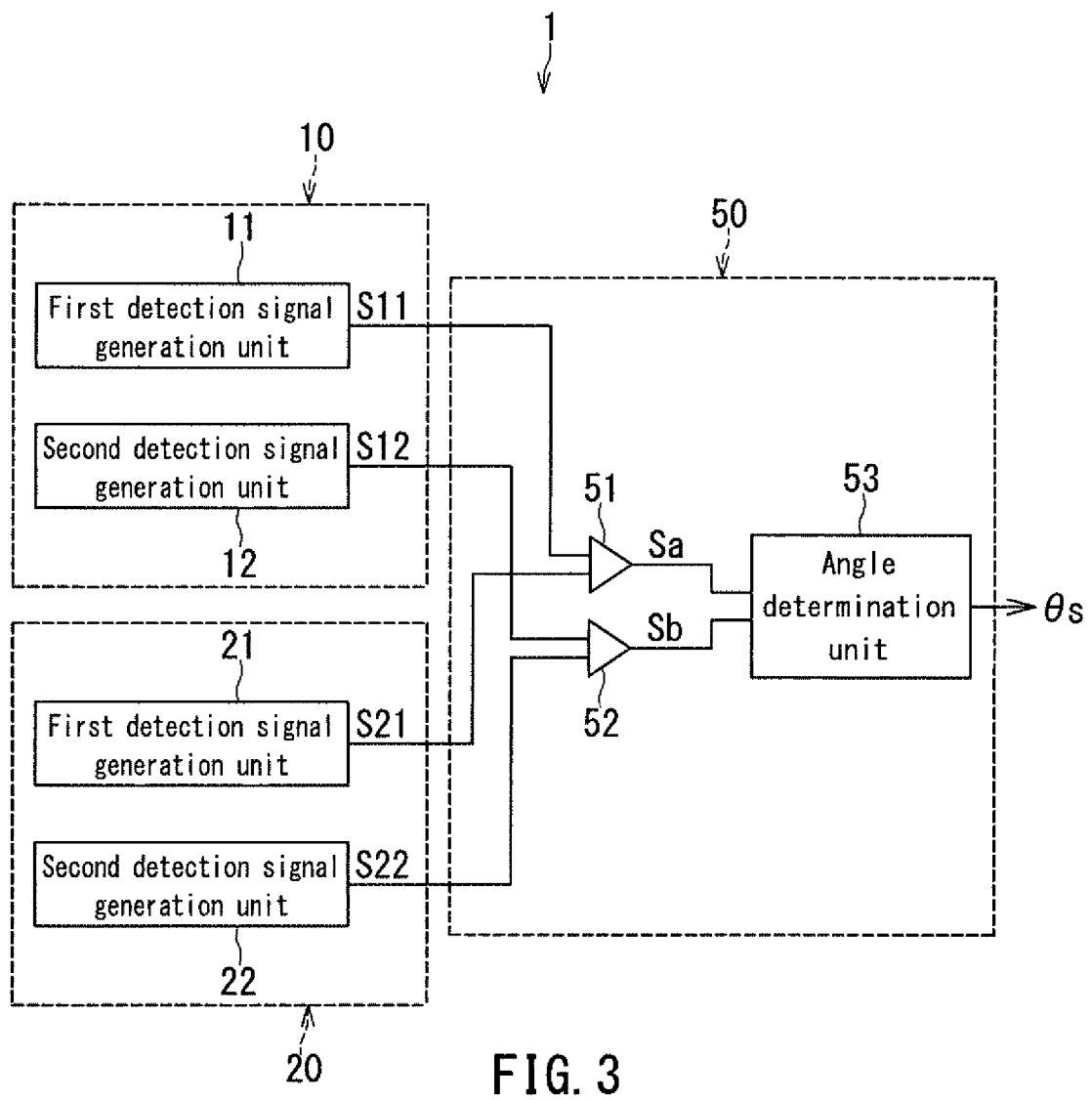
FIG. 3 is a block diagram illustrating the configuration of an angle sensor according to the first embodiment of the invention.

Reference is now made to FIG. 3 to describe the configuration of the angle sensor 1 in detail. FIG. 3 is a functional block diagram illustrating the configuration of the angle sensor 1. As previously mentioned, the angle sensor 1 includes the plurality of detection units. Each of the plurality of detection units includes a first detection signal generation unit for generating a first detection signal representing the strength of a component in a first direction of the composite magnetic field, and a second detection signal generation unit for generating a second detection signal representing the strength of a component in a second direction of the composite magnetic field. In the present embodiment, in particular, the first direction and the second direction are orthogonal to each other. In the present embodiment, the first direction is the X direction, and the second direction is the Y direction. The first detection signals generated at the plurality of detection units have the same phase The second detection signals generated at the plurality of detection units have the same phase.

Each of the first and second detection signal generation units includes at least one magnetic detection element. The at least one magnetic detection element may include at least one magnetoresistance element. The magnetoresistance element may be a giant magnetoresistance (GMR) element, a tunneling magnetoresistance (TMR) element, or an anisotropic magnetoresistance (AMR) element. The at least one magnetic detection element may further include at least one other element for magnetic field detection than the magnetoresistance element, such as a Hall element.

In the present embodiment, the plurality of detection units are the first detection unit 10 and the second detection unit 20. The first detection unit 10 includes a first detection signal generation unit 11 and a second detection signal generation unit 12. The first detection signal generation unit 11 generates a first detection signal S11 representing the strength of a component in the first direction (X direction) of the first composite magnetic field MF1. The second detection signal generation unit 12 generates a second detection signal S12 representing the strength of a component in the second direction (Y direction) of the first composite magnetic field MF1.

The second detection unit 20 includes a first detection signal generation unit 21 and a second detection signal generation unit 22. The first detection signal generation unit 21 generates a first detection signal S21 representing the strength of a component in the first direction (X direction) of the second composite magnetic field MF2. The second detection signal generation unit 22 generates a second detection signal S22 representing the strength of a component in the second direction (Y direction) of the second composite magnetic field MF2.

As the direction of the magnetic field to be detected rotates with a predetermined period, the rotating field angle θM varies with the predetermined period. In this case, all the detection signals S11, S12, S21 and S22 vary periodically with a signal period equal to the aforementioned predetermined period. The first detection signal S11 and the first detection signal S21 have the same phase. The second detection signal S12 and the second detection signal S22 have the same phase. The phase of the second detection signal S12 is different from the phase of the first detection signal S11 by an odd number of times ¼ the signal period. The phase of the second detection signal S22 is different from the phase of the first detection signal S21 by an odd number of times ¼ the signal period. In the light of the production accuracy of the magnetic detection elements or other factors, the relationships among the phases of the detection signals may be slightly different from the above-described relationships.

In the present embodiment, it is required that the detection signal generation units 11, 12, 21 and 22 be used under the condition that the magnitudes of the detection signals S11, S12, S21 and S22 do not become saturated within the range of the strengths of the first and second composite magnetic fields MF1 and MF2.

Figure 4:
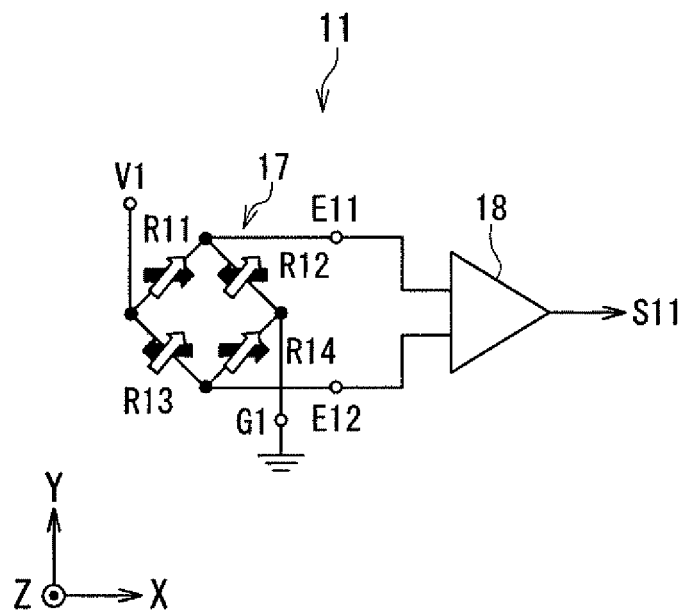
FIG. 4 is a circuit diagram illustrating an example configuration of a first detection signal generation unit of the first embodiment of the invention.

The configuration of the detection signal generation units 11, 12, 21 and 22 will now be described. FIG. 4 illustrates an example of the specific configuration of the first detection signal generation unit 11 of the first detection unit 10. In this example, the first detection signal generation unit 11 includes a Wheatstone bridge circuit 17 and a difference detector 18. The Wheatstone bridge circuit 17 includes a power supply port V1, a ground port G1, two output ports E11 and E12, a first pair of serially connected magnetic detection elements R11 and R12, and a second pair of serially connected magnetic detection elements R13 and R14. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded.

The first detection signal generation unit 21 of the second detection unit 20 has the same configuration as the first detection signal generation unit 11 of the first detection unit 10. Thus, in the following description, components of the first detection signal generation unit 21 are denoted by the same reference signs as those used for the components of the first detection signal generation unit 11.

Figure 5:
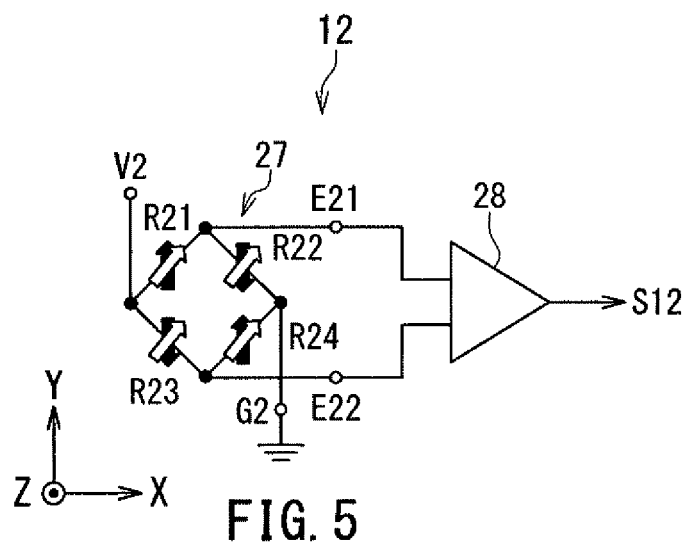
FIG. 5 is a circuit diagram illustrating an example configuration of a second detection signal generation unit of the first embodiment of the invention.

FIG. 5 illustrates an example of the specific configuration of the second detection signal generation unit 12 of the first detection unit 10. In this example, the second detection signal generation unit 12 includes a Wheatstone bridge circuit 27 and a difference detector 28. The Wheatstone bridge circuit 27 includes a power supply port V2, a ground port G2, two output ports E21 and E22, a first pair of serially connected magnetic detection elements R21 and R22, and a second pair of serially connected magnetic detection elements R23 and R24. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded.

The second detection signal generation unit 22 of the second detection unit 20 has the same configuration as the second detection signal generation unit 12 of the first detection unit 10. Thus, in the following description, components of the second detection signal generation unit 22 are denoted by the same reference signs as those used for the components of the second detection signal generation unit 12.

In the present embodiment, each of the magnetic detection elements R11 to R14 and R21 to R24 includes a plurality of magnetoresistance (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction varies according to the direction of the magnetic field to be detected, and a nonmagnetic layer located between the magnetization pinned layer and the free layer. The spin-valve MR element may be a TMR element or a GMR element. In the TMR element, the nonmagnetic layer is a tunnel barrier layer. In the GMR element, the nonmagnetic layer is a nonmagnetic conductive layer. The spin-valve MR element varies in resistance according to the angle that the magnetization direction of the free layer forms with respect to the magnetization direction of the magnetization pinned layer, and has a minimum resistance when the foregoing angle is 0° and a maximum resistance when the foregoing angle is 180°. In FIG. 4 and FIG. 5, the filled arrows indicate the magnetization directions of the magnetization pinned layers of the MR elements, and the hollow arrows indicate the magnetization directions of the free layers of the MR elements.

In the first detection signal generation unit 11 of the first detection unit 10, the magnetization pinned layers of the MR elements included in the magnetic detection elements R11 and R14 are magnetized in the first direction, i.e., in the X direction, and the magnetization pinned layers of the MR elements included in the magnetic detection elements R12 and R13 are magnetized in the opposite direction to the first direction, i.e., in the −X direction. In this case, the potential difference between the output ports E11 and E12 varies according to the strength of the component in the first direction (X direction) of the first composite magnetic field MF1. The difference detector 18 outputs a signal corresponding to the potential difference between the output ports E11 and E12 as the first detection signal S11. Thus, the first detection signal generation unit 11 detects the strength of the component in the first direction (X direction) of the first composite magnetic field MF1 and generates the first detection signal S11 representing the strength.

In the second detection signal generation unit 12 of the first detection unit 10, the magnetization pinned layers of the MR elements included in the magnetic detection elements R21 and R24 are magnetized in the second direction, i.e., in the Y direction, and the magnetization pinned layers of the MR elements included in the magnetic detection elements R22 and R23 are magnetized in the opposite direction to the second direction, i.e., in the −Y direction. In this case, the potential difference between the output ports E21 and E22 varies according to the strength of the component in the second direction (Y direction) of the first composite magnetic field MF1. The difference detector 28 outputs a signal corresponding to the potential difference between the output ports E21 and E22 as the second detection signal S12. Thus, the second detection signal generation unit 12 detects the strength of the component in the second direction (Y direction) of the first composite magnetic field MF1 and generates the second detection signal S12 representing the strength.

In the first detection signal generation unit 21 of the second detection unit 20, the potential difference between the output ports E11 and E12 varies according to the strength of the component in the first direction (X direction) of the second composite magnetic field MF2. The difference detector 18 outputs a signal corresponding to the potential difference between the output ports E11 and E12 as the first detection signal S21. Thus, the first detection signal generation unit 21 detects the strength of the component in the first direction (X direction) of the second composite magnetic field MF2 and generates the first detection signal S21 representing the strength.

In the second detection signal generation unit 22 of the second detection unit 20, the potential difference between the output ports E21 and E22 varies according to the strength of the component in the second direction (Y direction) of the second composite magnetic field MF2. The difference detector 28 outputs a signal corresponding to the potential difference between the output ports E21 and E22 as the second detection signal S22. Thus, the second detection signal generation unit 22 detects the strength of the component in the second direction (Y direction) of the second composite magnetic field MF2 and generates the second detection signal S22 representing the strength.

In the light of the production accuracy of the MR elements and other factors, the magnetization directions of the magnetization pinned layers of the plurality of MR elements in the detection signal generation units 11, 12, 21 and 22 may be slightly different from the above-described directions.

Figure 6:
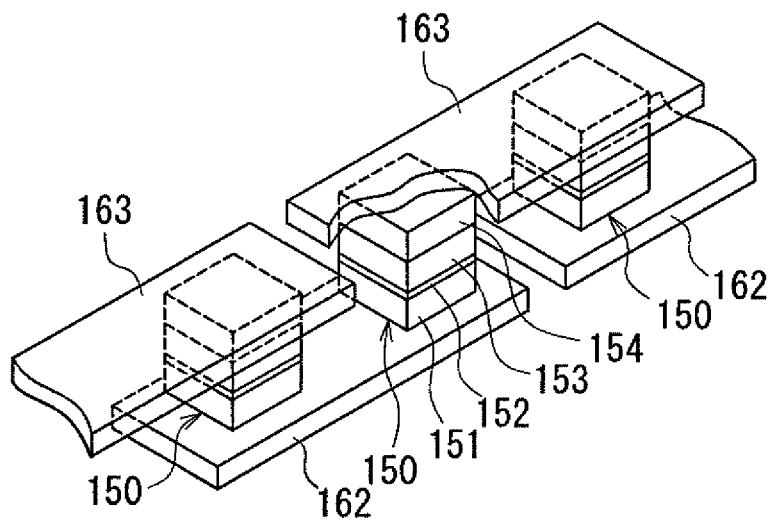
FIG. 6 is a perspective view of a portion of a magnetic detection element shown in FIG. 4 and FIG. 5.

An example of the configuration of the magnetic detection elements will now be described with reference to FIG. 6. FIG. 6 is a perspective view illustrating a portion of a magnetic detection element in the detection signal generation units 11 and 12 shown in FIG. 4 and FIG. 5. In this example, the magnetic detection element includes a plurality of lower electrodes 162, a plurality of MR elements 150 and a plurality of upper electrodes 163. The plurality of lower electrodes 162 are arranged on a substrate (not illustrated). Each of the lower electrodes 162 has a long slender shape. Every two lower electrodes 162 that are adjacent to each other in the longitudinal direction of the lower electrodes 162 have a gap therebetween. As shown in FIG. 6, MR elements 150 are provided on the top surfaces of the lower electrodes 162, near opposite ends in the longitudinal direction. Each of the MR elements 150 includes a free layer 151, a nonmagnetic layer 152, a magnetization pinned layer 153, and an antiferromagnetic layer 154 which are stacked in this order, the free layer 151 being closest to the lower electrode 162. The free layer 151 is electrically connected to the lower electrode 162. The antiferromagnetic layer 154 is formed of an antiferromagnetic material. The antiferromagnetic layer 154 is in exchange coupling with the magnetization pinned layer 153 so as to pin the magnetization direction of the magnetization pinned layer 153. The plurality of upper electrodes 163 are arranged over the plurality of MR elements 150. Each of the upper electrodes 163 has a long slender shape, and establishes electrical connection between the respective antiferromagnetic layers 154 of two adjacent MR elements 150 that are arranged on two lower electrodes 162 adjacent in the longitudinal direction of the lower electrodes 162. With such a configuration, the plurality of MR elements 150 in the magnetic detection element shown in FIG. 6 are connected in series by the plurality of lower electrodes 162 and the plurality of upper electrodes 163. It should be appreciated that the layers 151 to 154 of the MR elements 150 may be stacked in the reverse order to that shown in FIG. 6.

The angle sensor 1 further includes an angle computation unit 50 for generating the detected angle value θs. As mentioned previously, the magnetic field to be detected has different strengths at the plurality of detection positions. Thus, the plurality of first detection signals have mutually different amplitudes, and the plurality of second detection signals have mutually different amplitudes. The angle computation unit 50 generates the detected angle value θs by performing computations using a plurality of pairs of first and second detection signals generated at the plurality of detection units so that an error of the detected angle value θs resulting from the noise magnetic field Mex is made smaller than in the case of generating the detected angle value θs on the basis of only a pair of first and second detection signals generated at any one of the plurality of detection units.

In the present embodiment, the angle computation unit 50 generates the detected angle value θs using the difference between the first detection signal S11 generated at the first detection unit 10 and the first detection signal S21 generated at the second detection unit 20, and the difference between the second detection signal S12 generated at the first detection unit 10 and the second detection signal S22 generated at the second detection unit 20.

FIG. 3 shows an example configuration of the angle computation unit 50. In this example, the angle computation unit 50 includes a first computation unit 51, a second computation unit 52, and an angle determination unit 53. The first computation unit 51 performs a computation to determine the difference between the first detection signal S11 and the first detection signal S21 to generate a signal Sa. The signal Sa is expressed by the following Eq. (1).

$$Sa = S11 - S21 \quad (1)$$

The second computation unit 52 performs a computation to determine the difference between the second detection signal S12 and the second detection signal S22 to generate a signal Sb. The signal Sb is expressed by the following Eq. (2).

$$Sb = S12 - S22 \quad (2)$$

The angle determination unit 53 calculates the detected angle value θs on the basis of the signals Sa and Sb. To be more specific, the angle determination unit 53 calculates θs by the following Eq. (3). In Eq. (3), "a tan" represents arctangent.

$$\theta s = a\tan(Sb/Sa) \quad (3)$$

For θs within the range of 0° to less than 360°, Eq. (3) yields two solutions that are 180° different in value. Which of the two solutions for θs in Eq. (3) is the true value of θs can be determined from the combination of positive and negative signs of Sa and Sb. The angle determination unit 53 determines θs within the range of 0° to less than 360° using Eq. (3) and on the basis of the foregoing determination on the combination of positive and negative signs of Sa and Sb.

The angle determination unit 53 can be implemented by an application-specific integrated circuit (ASIC) or a microcomputer, for example. Note that the entirety of the angle computation unit 50 may be formed of an ASIC or a microcomputer.

According to the present embodiment, the detection signals S11, S12, S21 and S22 generated at the first and second detection units 10 and 20 are used to perform the computations to generate the detected angle value θs. This allows the detected angle value θs to contain a smaller angular error caused by the noise magnetic field Mex than in the case of generating the detected angle value on the basis of only the first and second detection signals S11 and S12 or only the first and second detection signals S21 and 22. The reason therefor will be described in detail below.

The first detection signal S11 represents the strength of the component in the first direction of the first composite magnetic field MF1. The first composite magnetic field MF1 is a composite magnetic field of the first partial magnetic field MFa and the noise magnetic field Mex. Thus, the first detection signal S11 contains a main component resulting from a component in the first direction of the first partial magnetic field MFa, and an error component resulting from a component in the first direction of the noise magnetic field Mex. The main component of the first detection signal S11 represents the strength of the component in the first direction of the first partial magnetic field MFa.

The first detection signal S21 represents the strength of the component in the first direction of the second composite magnetic field MF2. The second composite magnetic field MF2 is a composite magnetic field of the second partial magnetic field MFb and the noise magnetic field Mex. Thus, the first detection signal S21 contains a main component resulting from a component in the first direction of the second partial magnetic field MFb, and an error component resulting from the component in the first direction of the noise magnetic field Mex. The main component of the first detection signal S21 represents the strength of the component in the first direction of the second partial magnetic field MFb.

The direction and strength of the noise magnetic field Mex at the second detection position P2 are the same as the direction and strength of the noise magnetic field Mex at the first detection position P1, respectively. Accordingly, the error component of the first detection signal S11 and the error component of the first detection signal S21 are equal or nearly equal. Thus, by defining the signal Sa as the difference between the first detection signal S11 and the first detection signal S21 by Eq. (1), the error component of the first detection signal S11 and the error component of the first detection signal S21 cancel each other out, thereby allowing the signal Sa to contain a significantly reduced error component that originates from the component in the first direction of the noise magnetic field Mex, as compared with the first detection signals S11 and S21.

However, if the main component of the first detection signal S11 and the main component of the first detection signal S21 are equal to each other, obtaining the signal Sa by Eq. (1) causes also the main components of the first detection signals S11 and S21 to cancel each other out. This makes the signal Sa zero or almost zero regardless of the rotating field angle θM, thus causing the signal Sa to contain no information about the rotating field angle θM.

In the present embodiment, in contrast, since the first and second partial magnetic fields MFa and MFb have different strengths, the main component of the first detection signal S11 and the main component of the first detection signal S21 have different amplitudes. Thus, the signal Sa obtained by Eq. (1) does not become zero or almost zero regardless of the rotating field angle θM, but varies according to the rotating field angle θM.

The foregoing description concerning the first detection signals S11 and S21 holds true for the second detection signals S12 and S22. To be more specific, the second detection signal S12 represents the strength of the component in the second direction of the first composite magnetic field MF1, and contains a main component resulting from a component in the second direction of the first partial magnetic field MFa and an error component resulting from a component in the second direction of the noise magnetic field Mex. The main component of the second detection signal S12 represents the strength of the component in the second direction of the first partial magnetic field MFa. The second detection signal S22 represents the strength of the component in the second direction of the second composite magnetic field MF2, and contains a main component resulting from a component in the second direction of the second partial magnetic field MFb and an error component resulting from the component in the second direction of the noise magnetic field Mex. The main component of the second detection signal S22 represents the strength of the component in the second direction of the second partial magnetic field MFb.

The error component of the second detection signal S12 and the error component of the second detection signal S22 are equal or nearly equal. Thus, by defining the signal Sb as the difference between the second detection signal S12 and the second detection signal S22 by Eq. (2), the error component of the second detection signal S12 and the error component of the second detection signal S22 cancel each other out, thereby allowing the signal Sb to contain a significantly reduced error component that originates from the component in the second direction of the noise magnetic field Mex, as compared with the second detection signals S12 and S22.

In the present embodiment, since the first and second partial magnetic fields MFa and MFb have different strengths, the main component of the second detection signal S12 and the main component of the second detection signal S22 have different amplitudes. Thus, the signal Sb obtained by Eq. (2) does not become zero or almost zero regardless of the rotating field angle θM, but varies according to the rotating field angle θM.

Now, a description will be given of an ideal case in which the error component of the first detection signal S11 and the error component of the first detection signal S21 cancel each other out completely by Eq. (1), and the error component of the second detection signal S12 and the error component of the second detection signal S22 cancel each other out completely by Eq. (2).

In the present embodiment, the first direction and the second direction are orthogonal to each other. In the present embodiment, in particular, the first direction is the X direction, and the second direction is the Y direction. The strengths of the components in the first and second directions of the first partial magnetic field MFa can thus be expressed using, for example, the strength of the first partial magnetic field MFa and the angle that the direction of the first partial magnetic field MFa forms with respect to the first direction. To be more specific, the strength of the component in the first direction of the first partial magnetic field MFa is equal to the product of the strength of the first partial magnetic field MFa and the cosine of the angle that the direction of the first partial magnetic field MFa forms with respect to the first direction. The strength of the component in the second direction of the first partial magnetic field MFa is equal to the product of the strength of the first partial magnetic field MFa and the sine of the angle that the direction of the first partial magnetic field MFa forms with respect to the first direction.

Similarly, the strengths of the components in the first and second directions of the second partial magnetic field MFb can be expressed using, for example, the strength of the second partial magnetic field MFb and the angle that the direction of the second partial magnetic field MFb forms with respect to the first direction. To be more specific, the strength of the component in the first direction of the second partial magnetic field MFb is equal to the product of the strength of the second partial magnetic field MFb and the cosine of the angle that the direction of the second partial magnetic field MFb forms with respect to the first direction. The strength of the component in the second direction of the second partial magnetic field MFb is equal to the product of the strength of the second partial magnetic field MFb and the sine of the angle that the direction of the second partial magnetic field MFb forms with respect to the first direction.

In the present embodiment, the direction of each of the first and second partial magnetic fields MFa and MFb is the same as the direction of the magnetic field to be detected at the reference position. The reference direction DR is the X direction. Thus, the angle that the direction of the first partial magnetic field MFa forms with respect to the first direction and the angle that the direction of the second partial magnetic field MFb forms with respect to the first direction are equal to the rotating field angle θM, which is the angle that the direction of the magnetic field to be detected at the reference position forms with respect to the reference direction DR.

As described previously, the main component of the first detection signal S11 represents the strength of the component in the first direction of the first partial magnetic field MFa. Thus, the main component of the first detection signal S11 represents the product of the strength of the first partial magnetic field MFa and the cosine of the rotating field angle θM. The main component of the first detection signal S21 represents the strength of the component in the first direction of the second partial magnetic field MFb. Thus, the main component of the first detection signal S21 represents the product of the strength of the second partial magnetic field MFb and the cosine of the rotating field angle θM. Ideally, the signal Sa represents the product of a virtual strength that corresponds to the difference between the strength of the first partial magnetic field MFa and the strength of the second partial magnetic field MFb, and the cosine of the rotating field angle θM.

As described previously, the main component of the second detection signal S12 represents the strength of the component in the second direction of the first partial magnetic field MFa. Thus, the main component of the second detection signal S12 represents the product of the strength of the first partial magnetic field MFa and the sine of the rotating field angle θM. The main component of the second detection signal S22 represents the strength of the component in the second direction of the second partial magnetic field MFb. Thus, the main component of the second detection signal S22 represents the product of the strength of the second partial magnetic field MFb and the sine of the rotating field angle θM. Ideally, the signal Sb represents the product of the aforementioned virtual strength and the sine of the rotating field angle θM.

Thus, ideally, Sb/Sa represents the tangent of the rotating field angle θM, and Eq. (3) represents the rotating field angle θM. In this way, the present embodiment enables generation of the detected angle value θs in which the angular error resulting from the noise magnetic field Mex is reduced.

To generate the detected angle value θs as described above in the present embodiment, it is required to satisfy the condition that the strength of the first partial magnetic field MFa and the strength of the second partial magnetic field MFb are different from each other; however, this condition introduces no substantial limitations with respect to the structure or installation of the angle sensor 1 or the angle sensor system 100. The aforementioned condition can easily be satisfied by, for example, making the first detection position P1 and the second detection position P2 differ from each other as in the present embodiment. The present embodiment thus enables reduction of the angular error resulting from the noise magnetic field Mex, without introducing any substantial limitations with respect to the structure or installation of the angle sensor 1 or the angle sensor system 100.

The effects of the present embodiment will now be described with reference to simulation results. The simulation obtained a first detected angle value θs1, a second detected angle value θs2, and a detected angle value θs in the presence of a noise magnetic field Mex having a constant direction and strength. The first and second detected angle values θs1 and θs2 were calculated by the following Eqs. (4) and (5), respectively. As with the detected angle value θs, the first and second detected angle values θs1 and θs2 were obtained within the range of 0° to less than 360°.

$$\theta s1 = a\tan(S12/S11) \quad (4)$$

$$\theta s2 = a\tan(S22/S21) \quad (5)$$

The simulation also obtained an angular error of the first detected angle value θs1 (hereinafter, "the first angular error AE1"), an angular error of the second detected angle value θs2 (hereinafter, "the second angular error AE2"), and an angular error AEs of the detected angle value θs. The simulation assumed the difference between the first detected angle value θs1 and the rotating field angle θM as the first angular error AE1, the difference between the second detected angle value θs2 and the rotating field angle θM as the second angular error AE2, and the difference between the detected angle value θs and the rotating field angle θM as the angular error AEs of the detected angle value θs.

Figure 7:
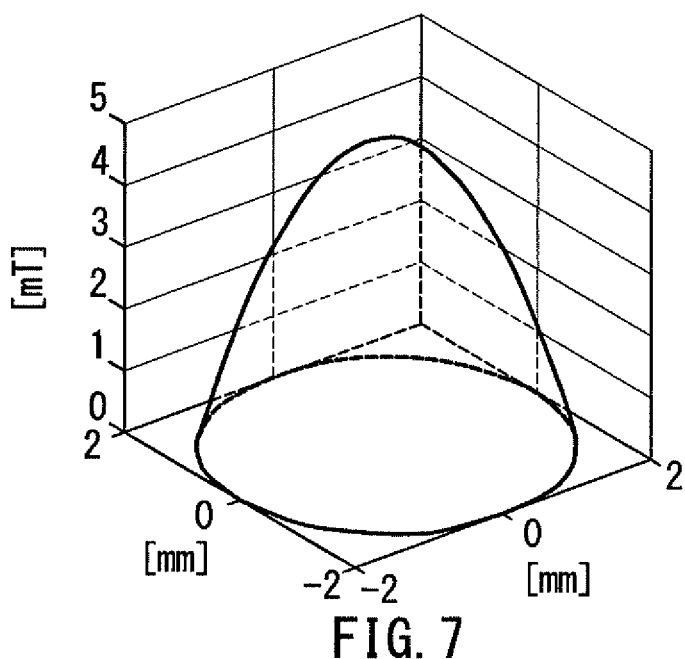
FIG. 7 is an explanatory diagram schematically illustrating the distribution of the strength of a magnetic field generated by a magnetic field generation unit.

In the simulation, a magnetic field whose strength decreases with increasing distance from the center of rotation C (see FIG. 1) in the reference plane P was assumed as a magnetic field generated by the magnetic field generation unit 5. FIG. 7 is an explanatory diagram schematically illustrating the distribution of the strength of the magnetic field. In FIG. 7, the vertical axis is in units of mT, and two axes orthogonal to the vertical axis are in units of mm. In FIG. 7, the origin point of the two axes orthogonal to the vertical axis is set at the reference position, that is, the point of intersection of the reference plane P and the center of rotation C (see FIG. 1). In the simulation, the first detection position P1 was set at the aforementioned origin point, and the second detection position P2 was set at the position that is 1 mm distant from the first detection position P1 in the X direction. The strength of the noise magnetic field Mex was set at 0.5 mT, and the direction of the noise magnetic field Mex was set in the direction rotated by 60° from the X direction toward the Y direction.

Figure 8A:
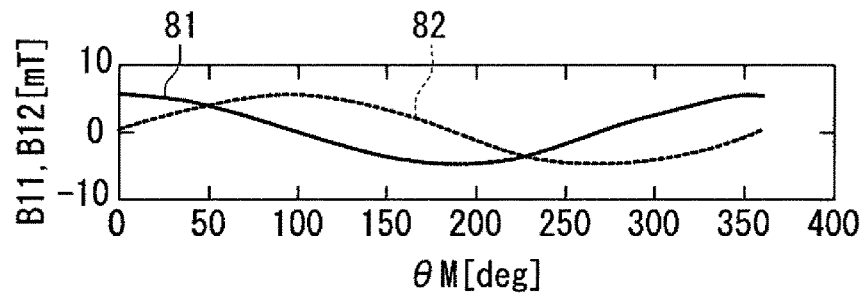
FIGS. 8A to 8D are explanatory diagrams illustrating simulation contents for the first embodiment of the invention.

FIG. 8A to FIG. 9D are explanatory diagrams illustrating the simulation contents. FIG. 8A shows the strength B11 of the component in the first direction (X direction) of the first composite magnetic field MF1 and the strength B12 of the component in the second direction (Y direction) of the first composite magnetic field MF1. FIG. 8B shows the first and second detection signals S11 and S12. FIG. 8C shows the first detected angle value θs1. FIG. 8D shows the first angular error AE1. In each of FIGS. 8A to 8D, the horizontal axis represents the rotating field angle θM, which is equal to the angle to be detected. The vertical axis of FIG. 8A represents the values of the strengths B11 and B12 (in mT). In FIG. 8A, the curve 81 represents the strength B11, and the curve 82 represents the strength B12. The vertical axis of FIG. 8B represents the values of the first and second detection signals S11 and S12 (in V). In FIG. 8B, the curve 83 represents the first detection signal S11, and the curve 84 represents the second detection signal S12. The vertical axis of FIG. 8C represents the first detected angle value θs1. (in degrees). The vertical axis of FIG. 8D represents the value of the first angular error AE1 (in degrees).

Figure 9A:
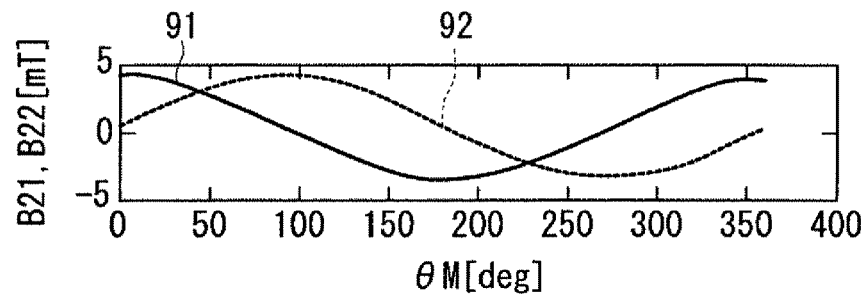
FIGS. 9A to 9D are explanatory diagrams illustrating simulation contents for the first embodiment of the invention.
Figure 9B:
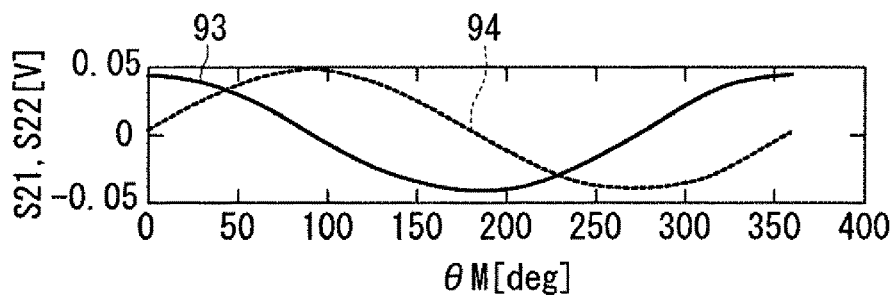
Figure 9C:
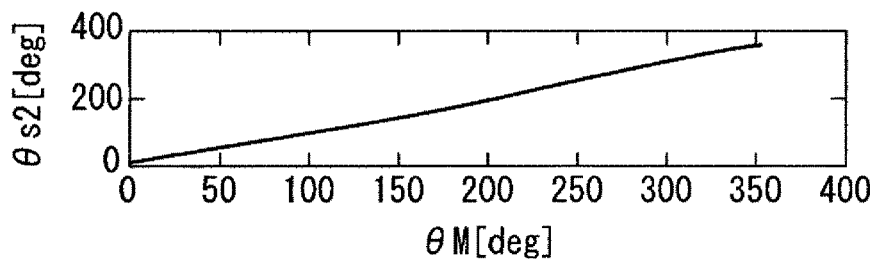
Figure 9D:
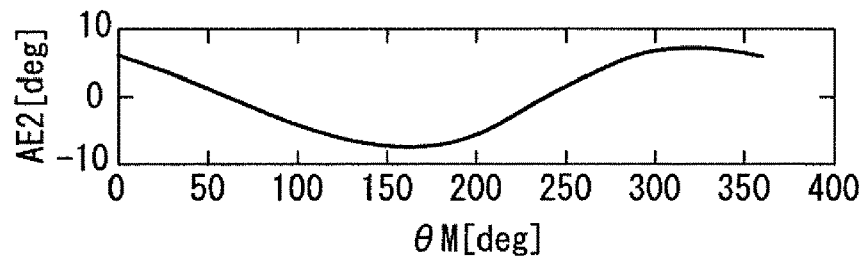

FIG. 9A shows the strength B21 of the component in the first direction (X direction) of the second composite magnetic field MF2 and the strength B22 of the component in the second direction (Y direction) of the second composite magnetic field MF2. FIG. 9B shows the first and second detection signals S21 and S22. FIG. 9C shows the second detected angle value θs2. FIG. 9D shows the second angular error AE2. In each of FIGS. 9A to 9D, the horizontal axis represents the rotating field angle θM, which is equal to the angle to be detected. The vertical axis of FIG. 9A represents the values of the strengths B21 and B22 (in mT). In FIG. 9A, the curve 91 represents the strength B21, and the curve 92 represents the strength B22. The vertical axis of FIG. 9B represents the values of the first and second detection signals S21 and S22 (in V). In FIG. 9B, the curve 93 represents the first detection signal S21, and the curve 94 represents the second detection signal S22. The vertical axis of FIG. 9C represents the second detected angle value θs2 (in degrees). The vertical axis of FIG. 9D represents the value of the second angular error AE2 (in degrees).

Figure 10:
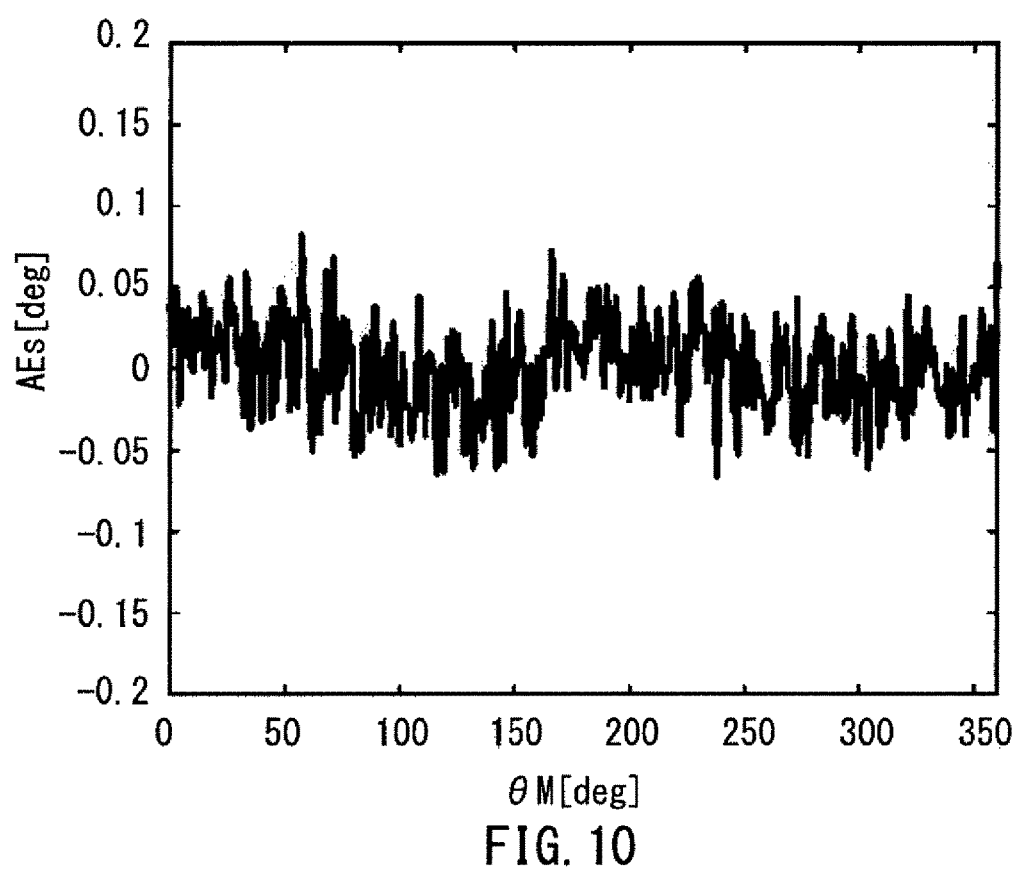
FIG. 10 is a waveform diagram illustrating an example of the waveform of an angular error obtained in the simulation for the first embodiment of the invention.

FIG. 10 is a waveform diagram illustrating an example of the waveform of the angular error AEs obtained in the simulation. In FIG. 10 the horizontal axis represents the rotating field angle θM, and the vertical axis represents the value of the angular error AEs (in degrees).

Figure 8B:
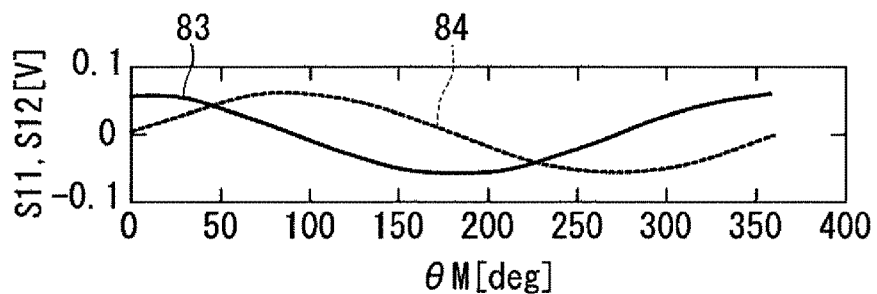
Figure 8C:
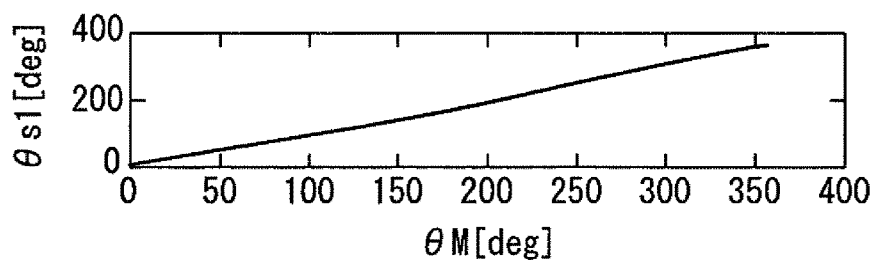

As shown in FIG. 8A and FIG. 9A, the strength B11 of the component in the first direction of the first composite magnetic field MF1 and the strength B21 of the component in the first direction of the second composite magnetic field MF2 are different from each other, and the strength B12 of the component in the second direction of the first composite magnetic field MF1 and the strength B22 of the component in the second direction of the second composite magnetic field MF2 are different from each other. Accordingly, as shown in FIG. 8B and FIG. 9B, the first detection signals S11 and S21 are different in amplitude from each other, and the second detection signals S12 and S22 are different in amplitude from each other.

Figure 8D:
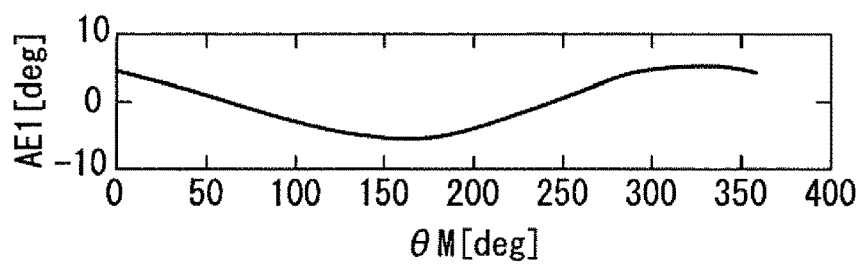

Further, as shown in FIG. 8D, FIG. 9D and FIG. 10, the angular error AEs of the detected angle value θs is extremely smaller than the first and second angular errors AE1 and AE2. The first and second angular errors AE1 and AE2 result mainly from the noise magnetic field Mex. On the other hand, the angular error AEs of the detected angle value θs results mainly from factors other than the noise magnetic field Mex. The results of the simulation described above indicate that the present embodiment enables reduction of angular errors caused by the noise magnetic field Mex.

Second Embodiment

A second embodiment of the present invention will now be described. First, reference is made to FIG. 11 to describe the configuration of the angle sensor 1 according to the second embodiment. The angle sensor 1 according to the second embodiment differs from the angle sensor 1 according to the first embodiment in the following ways. The angle sensor 1 according to the second embodiment includes, as the plurality of detection units, a third detection unit 30 and a fourth detection unit 40 in addition to the first and second detection units 10 and 20 described in relation to the first embodiment. The angle sensor 1 according to the second embodiment further includes an angle computation unit 250 in place of the angle computation unit 50 of the first embodiment. The angle computation unit 250 can be implemented by an ASIC or a microcomputer, for example. The angle computation unit 250 will be described in detail later.

The third detection unit 30 detects the composite magnetic field of the magnetic field to be detected and the noise magnetic field at a third detection position P3. The fourth detection unit 40 detects the composite magnetic field of the magnetic field to be detected and the noise magnetic field at a fourth detection position P4. In the present embodiment, the first to fourth detection positions P1 to P4 are located in one plane, specifically, in the reference plane P (see FIG. 1.). In the present embodiment, the first to fourth detection positions P1 to P4 are particularly defined to be at different distances from the center of rotation C (see FIG. 1).

Hereinafter, the magnetic field to be detected at the third detection position P3 will be referred to as the third partial magnetic field MFc, and the magnetic field to be detected at the fourth detection position P4 will be referred to as the fourth partial magnetic field MFd. Like the directions of the first and second partial magnetic fields MFa and MFb described in relation to the first embodiment, the directions of the third and fourth partial magnetic fields MFc and MFd vary according to the angle to be detected and the rotating field angle θM. Since the first to fourth detection positions P1 to P4 are different from each other, the strengths of the first to fourth partial magnetic fields MFa to MFd are different from each other.

The composite magnetic field at the third detection position P3 will be referred to as the third composite magnetic field MF3, and the composite magnetic field at the fourth detection position P4 will be referred to as the fourth composite magnetic field MF4. The third composite magnetic field MF3 is a composite magnetic field of the third partial magnetic field MFc and the noise magnetic field Mex. The fourth composite magnetic field MF4 is a composite magnetic field of the fourth partial magnetic field MFd and the noise magnetic field Mex. The noise magnetic field Mex is in the same direction and has the same strength at the first to fourth detection positions P1 to P4.

The third and fourth composite magnetic fields MF3 and MF4 and the third and fourth partial magnetic fields MFc and MFd will now be described in more detail. Assume that the directions of the third and fourth composite magnetic fields MF3 and MF4 rotate in the same direction (counterclockwise direction in FIG. 2) as the directions of the first and second composite magnetic fields MF1 and MF2 described in relation to the first embodiment. The positive and negative signs of the angle that each of the third and fourth composite magnetic fields MF3 and MF4 forms with respect to the reference direction DR (see FIG. 2) are defined in the same manner as those of the angles θ1 and θ2 described in relation to the first embodiment.

The main component of the third composite magnetic field MF3 is the third partial magnetic field MFc. The main component of the fourth composite magnetic field MF4 is the fourth partial magnetic field MFd. The first and second partial magnetic fields MFa and MFb are in the same direction. In the present embodiment, the direction of each of the first to fourth partial magnetic fields MFa to MFd is assumed to be the same as the direction of the magnetic field to be detected at the reference position. In this case, the angle that each of the first to fourth partial magnetic fields MFa to MFd forms with respect to the reference direction DR is equal to the rotating field angle θM. The positive and negative signs of the aforementioned angle are defined in the same manner as those of the angles θ1 and θ2.

Figure 11:
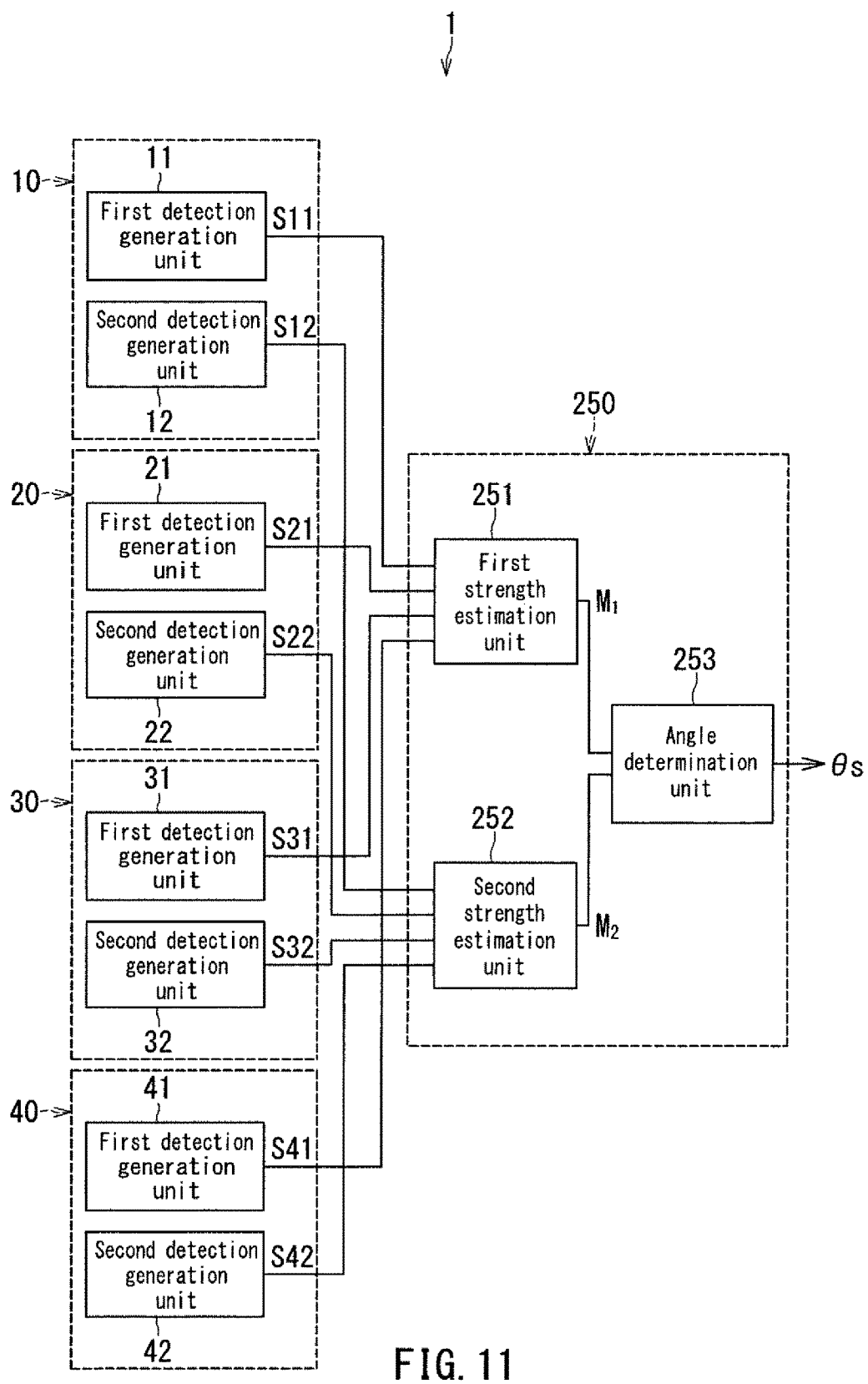
FIG. 11 is a functional block diagram illustrating the configuration of an angle sensor according to a second embodiment of the invention.

Reference is now made to FIG. 11 to describe the configuration of the third and fourth detection units 30 and 40 in detail. The third detection unit 30 includes a first detection signal generation unit 31 and a second detection signal generation unit 32. The first detection signal generation unit 31 generates a first detection signal S31 representing the strength of a component in the first direction of the third composite magnetic field MF3. The second detection signal generation unit 32 generates a second detection signal S32 representing the strength of a component in the second direction of the third composite magnetic field MF3.

The fourth detection unit 40 includes a first detection signal generation unit 41 and a second detection signal generation unit 42. The first detection signal generation unit 41 generates a first detection signal S41 representing the strength of a component in the first direction of the fourth composite magnetic field MF4. The second detection signal generation unit 42 generates a second detection signal S42 representing the strength of a component in the second direction of the fourth composite magnetic field MF4.

The first detection unit 10 and the second detection unit 20 are configured in the same manner as in the first embodiment. To be more specific, the first detection unit 10 includes the first detection signal generation unit 11 and the second detection signal generation unit 12. The first detection signal generation unit 11 generates the first detection signal S11. The second detection signal generation unit 12 generates the second detection signal S12. The second detection unit 20 includes the first detection signal generation unit 21 and the second detection signal generation unit 22. The first detection signal generation unit 21 generates the first detection signal S21. The second detection signal generation unit 22 generates the second detection signal S22.

In the present embodiment, as in the first embodiment, the first direction is the X direction (see FIG. 2) and the second direction is the Y direction (see FIG. 2). As the direction of the magnetic field to be detected rotates with a predetermined period, the rotating field angle θM varies with the predetermined period. In this case, all the detection signals S11, S12, S21, S22, S31, S32, S41 and S42 vary periodically with a signal period equal to the aforementioned predetermined period. The first detection signals S11, S21, S31 and S41 have the same phase. The second detection signals S12, S22, S32 and S42 have the same phase. The phase of the second detection signal S32 is different from the phase of the first detection signal S31 by an odd number of times ¼ the signal period. The phase of the second detection signal S42 is different from the phase of the first detection signal S41 by an odd number of times ¼ the signal period. In the light of the production accuracy of the magnetic detection elements or other factors, the relationships among the phases of the detection signals may be slightly different from the above-described relationships.

In the present embodiment, it is required that the detection signal generation units 11, 12, 21, 22, 31, 32, 41 and 42 be used under the condition that the magnitudes of the detection signals S11, S12, S21, S22, S31, S32, S41 and S42 do not become saturated within the range of the strengths of the first to fourth composite magnetic fields MF1 to MF4.

The configuration of the detection signal generation units 31, 32, 41 and 42 will now be described. Each of the first detection signal generation units 31 and 41 has the same configuration as that of the first detection signal generation unit 11 described in relation to the first embodiment. Thus, in the following description, components of the first detection signal generation units 31 and 41 are denoted by the same reference signs as those used for the components of the first detection signal generation unit 11 of the first embodiment shown in FIG. 4.

Each of the second detection signal generation units 32 and 42 has the same configuration as that of the second detection signal generation unit 12 described in relation to the first embodiment. Thus, in the following description, components of the second detection signal generation units 32 and 42 are denoted by the same reference signs as those used for the components of the second detection signal generation unit 12 of the first embodiment shown in FIG. 5.

In the first detection signal generation unit 31 of the third detection unit 30, the potential difference between the output ports E11 and E12 varies according to the strength of the component in the first direction (X direction) of the third composite magnetic field MF3. The difference detector 18 outputs a signal corresponding to the potential difference between the output ports E11 and E12 as the first detection signal S31. Thus, the first detection signal generation unit 31 detects the strength of the component in the first direction (X direction) of the third composite magnetic field MF3 and generates the first detection signal S31 representing the strength.

In the second detection signal generation unit 32 of the third detection unit 30, the potential difference between the output ports E21 and E22 varies according to the strength of the component in the second direction (Y direction) of the third composite magnetic field MF3. The difference detector 28 outputs a signal corresponding to the potential difference between the output ports E21 and E22 as the second detection signal S32. Thus, the second detection signal generation unit 32 detects the strength of the component in the second direction (Y direction) of the third composite magnetic field MF3 and generates the second detection signal S32 representing the strength.

In the first detection signal generation unit 41 of the fourth detection unit 40, the potential difference between the output ports E11 and E12 varies according to the strength of the component in the first direction (X direction) of the fourth composite magnetic field MF4. The difference detector 18 outputs a signal corresponding to the potential difference between the output ports E11 and E11 as the first detection signal S41. Thus, the first detection signal generation unit 41 detects the strength of the component in the first direction (X direction) of the fourth composite magnetic field MF4 and generates the first detection signal S41 representing the strength.

In the second detection signal generation unit 42 of the fourth detection unit 40, the potential difference between the output ports E21 and E22 varies according to the strength of the component in the second direction (Y direction) of the fourth composite magnetic field MF4. The difference detector 28 outputs a signal corresponding to the potential difference between the output ports E21 and E22 as the second detection signal S42. Thus, the second detection signal generation unit 42 detects the strength of the component in the second direction (Y direction) of the fourth composite magnetic field MF4 and generates the second detection signal S42 representing the strength.

Now, the angle computation unit 250 will be described in detail. The angle computation unit 250 generates the detected angle value θs using the method of least squares on the basis of a plurality of pairs of first and second detection signals generated at the first to fourth detection units 10, 20, 30 and 40. The generation method for the detected angle value θs in the present embodiment will be conceptually described below. In the present embodiment, the reference sign S1 is used to represent any of the first detection signals, and the reference sign S2 is used to represent any of the second detection signals. The angle computation unit 250 assumes first unknown magnetic field information M, second unknown magnetic field information E, a plurality of first assumed detection values ES1, a plurality of second assumed detection values ES2, a plurality of first residuals R1, and a plurality of second residuals R2.

The first unknown magnetic field information M corresponds to the strengths, at a predetermined position, of a component in the first direction and a component in the second direction of the magnetic field to be detected. The predetermined position is a virtual position at which the direction of the magnetic field to be detected is the same as the direction thereof at the reference position, as with the first to fourth detection positions P1 to P4, and at which the direction and strength of the noise magnetic field Mex are the same as the direction and strength of the noise magnetic field at the first to fourth detection positions P1 to P4. The second unknown magnetic field information E corresponds to the strengths of the component in the first direction and the component in the second direction of the noise magnetic field Mex. Each of the plurality of first assumed detection values ES1 is a value that corresponds to one of the first detection signals S1 generated at the plurality of detection units and is assumed on the basis of the first and second unknown magnetic field information M and E. Each of the plurality of second assumed detection values ES2 is a value that corresponds to one of the second detection signals S2 generated at the plurality of detection units and is assumed on the basis of the first and second unknown magnetic field information M and E. Each of the plurality of first residuals R1 is a difference between one of the first detection signals S1 generated at the plurality of detection units and a corresponding one of the first assumed detection values ES1. Each of the plurality of second residuals R2 is a difference between one of the second detection signals S2 generated at the plurality of detection units and a corresponding one of the second assumed detection values ES2.

The angle computation unit 250 estimates the first and second unknown magnetic field information M and E so as to minimize the sum of squares of the plurality of first residuals R1 and to minimize the sum of squares of the plurality of second residuals R2, and determines the detected angle value θs on the basis of the estimated first unknown magnetic field information M.

In the present embodiment, the plurality of first assumed detection values ES1 are modeled by the following Eq. (6).

$$z_1 = 11x_1 \qquad (6)$$

In Eq. (6), $z_1$ is an m-dimensional column vector containing m-number of elements having correspondences with the plurality of first assumed detection values ES1 generated on the basis of the first and second unknown magnetic field information M and E to be obtained. Note that m is an integer that represents the number of the plurality of first assumed detection values ES1, and is equal to the number of the plurality of first detection signals S1, in other words, the number of the plurality of detection units. In Eq. (6), H is a matrix with m-number of rows and two columns defined according to the patterns of the magnetic field to be detected and the noise magnetic field Mex at the plurality of detection positions. In Eq. (6), $x_1$ is a 2-dimensional column vector containing, as its elements, the strength $M_1$ of a component in the first direction of the first unknown magnetic field information M and the strength $E_1$ of a component in the first direction of the second unknown magnetic field information E.

The present embodiment estimates the strengths $M_1$ and $E_1$, which are the elements of the column vector $x_1$. Here, let $y_1$ represent an m-dimensional column vector containing m-number of elements having correspondences with the plurality of first detection signals S1. The column vector $x_1$ is estimated so as to minimize the sum of squares of differences between respective corresponding ones of the m-number of elements of the column vector $y_1$ and the m-number of elements of the column vector $z_1$. In the concrete, this is accomplished by defining a least squares cost function F for estimating the column vector $x_1$, and obtaining the column vector $x_1$ that minimizes the value of the function F. The function F is defined by the following Eq. (7).

$$F = \|y_1 - z_1\|^2 \quad (7)$$
$$= \|y_1 - Hx_1\|^2$$
$$= (y_1 - Hx_1)^T(y_1 - Hx_1)$$
$$= y_1^T y_1 - x_1^T H^T y_1 - y_1^T H x_1 + x_1^T H^T H x_1$$

Partial differentiation of Eq. (7) with respect to $x_1$ yields the following Eq. (8).

$$\partial F/\partial x_1 = 2(-H^T y_1 + H^T H x_1) \quad (8)$$

When $x_1$ minimizes the value of the function F, $\partial F/\partial x_1 = 0$ is satisfied. Thus, $x_1$ that minimizes the value of the function F is represented by the following Eq. (9).

$$x_1 = (H^T H)^{-1} H^T y_1 \quad (9)$$

Further, in the present embodiment, the plurality of second assumed detection values ES2 are modeled by the following Eq. (10).

$$z_2 = H x_2 \quad (10)$$

In Eq. (10), $z_2$ is an m-dimensional column vector containing m-number of elements having correspondences with the plurality of second assumed detection values ES2 generated on the basis of the first and second unknown magnetic field information M and E to be obtained. In Eq. (10), $x_2$ is a 2-dimensional column vector containing, as its elements, the strength $M_2$ of a component in the second direction of the first unknown magnetic field information M and the strength $E_2$ of a component in the second direction of the second unknown magnetic field information E.

The present embodiment estimates the strengths $M_2$ and $E_2$, which are the elements of the column vector $x_2$. Here, let $y_2$ represent an m-dimensional column vector containing m-number of elements having correspondences with the plurality of second detection signals S2. The column vector $x_2$ is estimated so as to minimize the sum of squares of differences between respective corresponding ones of the m-number of elements of the column vector $y_2$ and the m-number of elements of the column vector $z_2$. A concrete estimation method for the column vector $x_2$ is the same as the estimation method for the column vector $x_1$ described with reference to Eqs. (7) to (9). Replacing $x_1$, $y_1$, and $z_1$ in the description of the estimation method for the column vector $x_1$ with $x_2$, $y_2$, and $z_2$, respectively, provides a description of the estimation method for the column vector $x_2$. Eq. (11) below gives $x_2$ that minimizes the value of the least squares cost function F for estimating the column vector $x_2$.

$$x_2 = (H^T H)^{-1} H^T y_2 \quad (11)$$

In the present embodiment, the angle computation unit 250 determines the detected angle value θs on the basis of the strength $M_1$, which is one of the two elements of the column vector $x_1$ calculated by Eq. (9), and the strength $M_2$, which is one of the two elements of the column vector $x_2$ calculated by Eq. (11).

As described above, the column vector $y_1$ contains a plurality of elements having correspondences with the plurality of first detection signals S1, and the column vector $z_1$ contains a plurality of elements having correspondences with the plurality of first assumed detection values ES1. The column vector $y_2$ contains a plurality of elements having correspondences with the plurality of second detection signals S2, and the column vector $z_2$ contains a plurality of elements having correspondences with the plurality of second assumed detection values ES2. Thus, the estimation method for the column vectors $x_1$ and $x_2$, which has been described with reference to Eqs. (7) to (9) and (11), corresponds to the method of estimating the first and second unknown magnetic field information M and E so as to minimize the sum of squares of the plurality of first residuals R1 and to minimize the sum of squares of the plurality of second residuals R2.

Reference is now made to FIG. 11 to specifically describe the configuration of the angle computation unit 250 and the generation method for the detected angle value θs. FIG. 11 illustrates an example configuration of the angle computation unit 250. In this example, the angle computation unit 250 includes a first strength estimation unit 251, a second strength estimation unit 252, and an angle determination unit 253.

The first strength estimation unit 251 uses the first detection signals S11, S21, S31 and S41 to estimate the strength $M_1$ of the component in the first direction of the first unknown magnetic field information M, and the strength $E_1$ of the component in the first direction of the second unknown magnetic field information E. In the present embodiment, the foregoing reference position is the foregoing predetermined position. Here, let $z_{11}$ represent a first one of the plurality of first assumed detection values ES1 that corresponds to the first detection signal S11, and $z_{21}$ represent a second one of the plurality of first assumed detection values ES1 that corresponds to the first detection signal S21. Let $z_{31}$ represent a third one of the plurality of first assumed detection values ES1 that corresponds to the first detection signal S31, and $z_{41}$ represent a fourth one of the plurality of first assumed detection values ES1 that corresponds to the first detection signal S41. In the present embodiment, the first assumed detection values $z_{11}$, $z_{21}$, $z_{31}$ and $z_{41}$ are modeled by the following Eq. (12).

$$\begin{bmatrix} z_{11} \\ z_{21} \\ z_{31} \\ z_{41} \end{bmatrix} = \begin{bmatrix} Amp_1 & 1 \\ Amp_2 & 1 \\ Amp_3 & 1 \\ Amp_4 & 1 \end{bmatrix} \begin{bmatrix} M_1 \\ E_1 \end{bmatrix} \qquad (12)$$

The four-dimensional column vector on the left side of Eq. (12) corresponds to $z_1$ of Eq. (6).

The matrix with four rows and two columns on the right side of Eq. (12) corresponds to H of Eq. (6). This matrix is hereinafter represented by Hc. The four elements $Amp_1$ to $Amp_4$ of the first column of the matrix Hc are defined according to the patterns of the magnetic field to be detected at the first to fourth detection positions P1 to P4, in other words, the patterns of the first to fourth partial magnetic fields MFa to MFd. For example, the strengths of the first to fourth partial magnetic fields MFa to MFd may be measured, and $Amp_1$ to $Amp_4$ may be defined on the basis of the measurement results. Alternatively, $Amp_1$ to $Amp_4$ may be defined by modeling the distribution of the strength of the magnetic field to be detected in the reference plane P. $Amp_1$ to $Amp_4$ can be modeled by the following Eq. (13), for example.

$$Amp_n = c\{1 - (x_n^2/a + y_n^2/b)\} \qquad (13)$$

In Eq. (13), n is an integer between 1 and 4 inclusive. Now, a position in the reference plane P is represented in a rectangular coordinate system with its origin set at the reference position, that is, the point of intersection of the reference plane P and the center of rotation C (see FIG. 1). When the first to fourth detection positions P1 to P4 are represented in the aforementioned rectangular coordinate system, $x_n$ and $y_n$ represent positions in the X direction and in the Y direction, respectively. In Eq. (13), a, b, and c are constants that are determined on the basis of the distribution of the strength of the magnetic field to be detected in the reference plane P. For example, a, b, and c may be determined so as to minimize the sum of squares of the differences between a plurality of measured strengths of the magnetic field to be detected and a plurality of values obtained by Eq. (13), at a plurality of positions in the reference plane P.

Ideally, $Amp_1$ to $Amp_4$ are defined by measuring the strengths of the magnetic field to be detected at a plurality of positions in the reference plane P in the absence of the noise magnetic field Mex. If, however, the strength of the noise magnetic field Mex is sufficiently lower than that of the magnetic field to be detected, $Amp_1$ to $Amp_4$ may be defined in the above-described manner, with the strengths of the composite magnetic field of the magnetic field to be detected and the noise magnetic field Mex at the plurality of positions taken as the strengths of the magnetic field to be detected at the plurality of positions.

The four elements of the second column of the matrix Hc are defined according to the patterns of the noise magnetic field Mex at the first to fourth detection positions P1 to P4. In the present embodiment, the four elements of the second column of the matrix Hc are defined on the assumption that the noise magnetic field Mex is in the same direction and has the same strength at the first to fourth detection positions P1 to P4. More specifically, as represented by Eq. (12), all of the four elements of the second column of the matrix Hc are set at 1.

The two-dimensional column vector on the right side of Eq. (12) corresponds to $x_1$ of Eq. (6). This column vector is hereinafter represented by xc1. The column vector xc1 contains the strengths $M_1$ and $E_1$ as its elements.

The first strength estimation unit 251 estimates the column vector xc1 on the basis of Eq. (9). Here, let $y_{11}$, $y_{21}$, $y_{31}$ and $y_{41}$ represent the values of the first detection signals S11, S21, S31 and S41, respectively, and let yc1 represent a four-dimensional column vector containing $y_{11}$, $y_{21}$, $y_{31}$ and $y_{41}$ as its elements. The column vector yc1 is represented by the following Eq. (14).

$$yc1^T = [y_{11}, y_{21}, y_{31}, y_{41}] \qquad (14)$$

The first strength estimation unit 251 calculates xc1 using an equation that replaces H, $x_1$, and $y_1$ in Eq. (9) with Hc, xc1, and yc1, respectively. The strengths $M_1$ and $E_1$ are thereby estimated.

The second strength estimation unit 252 estimates the strength $M_2$ of the component in the second direction of the first unknown magnetic field information M, and the strength $E_2$ of the component in the second direction of the second unknown magnetic field information E. Here, let $z_{12}$ represent a first one of the plurality of second assumed detection values ES2 that corresponds to the second detection signal S12, and $z_{22}$ represent a second one of the plurality of second assumed detection values ES2 that corresponds to the second detection signal S22. Let $z_{32}$ represent a third one of the plurality of second assumed detection values ES2 that corresponds to the second detection signal S32, and $z_{42}$ represent a fourth one of the plurality of second assumed detection values ES2 that corresponds to the second detection signal S42. In the present embodiment, the second assumed detection values $z_{12}$, $z_{22}$, $z_{32}$ and $z_{42}$ are modeled by the following Eq. (15).

$$\begin{bmatrix} z_{12} \\ z_{22} \\ z_{32} \\ z_{42} \end{bmatrix} = \begin{bmatrix} Amp_1 & 1 \\ Amp_2 & 1 \\ Amp_3 & 1 \\ Amp_4 & 1 \end{bmatrix} \begin{bmatrix} M_2 \\ E_2 \end{bmatrix} \qquad (15)$$

The four-dimensional column vector on the left side of Eq. (15) corresponds to $z_2$ of Eq. (10). The matrix with four rows and two columns on the right side of Eq. (15) corresponds to H of Eq. (10). This matrix is the same as the matrix Hc mentioned above.

The two-dimensional column vector on the right side of Eq. (15) corresponds to $x_2$ of Eq. (10). This column vector is hereinafter represented by xc2. The column vector xc2 contains the strengths $M_2$ and $E_2$ as its elements.

The second strength estimation unit 252 estimates the column vector xc2 on the basis of Eq. (11). Here, let $y_{12}$, $y_{22}$, $y_{32}$ and $y_{42}$ represent the values of the second detection signals S12, S22, S32 and S42, respectively, and let yc2 represent a four-dimensional column vector containing $y_{12}$, $y_{22}$, $y_{32}$ and $y_{42}$ as its elements. The column vector yc2 is represented by the following Eq. (16).

$$yc2^T = [y_{12}, y_{22}, y_{32}, y_{42}] \qquad (16)$$

The second strength estimation unit 252 calculates xc2 using an equation that replaces H, $x_2$, and $y_2$ in Eq. (11) with Hc, xc2, and yc2, respectively. The strengths $M_2$ and $E_2$ are thereby estimated.

The angle determination unit 253 determines the detected angle value θs on the basis of the first unknown magnetic field information M estimated by the first and second strength estimation units 251 and 252. To be more specific, the angle determination unit 253 calculates θs by the following Eq. (17) using the strengths $M_1$ and $M_2$, for example.

$$\theta s = a\tan(M_2/M_1) \quad (17)$$

For θs within the range of 0° to less than 360°, Eq. (17) yields two solutions that are 180° different in value. Which of the two solutions for θs in Eq. (17) is the true value of θs can be determined from the combination of positive and negative signs of $M_1$ and $M_2$. The angle determination unit 253 obtains θs within the range of 0° to less than 360° using Eq. (17) and on the basis of the foregoing determination on the combination of positive and negative signs of $M_1$ and $M_2$.

In the present embodiment, the detected angle value θs is generated using the method of least squares on the basis of the detection signals S11, S12, S21, S22, S31, S32, S41 and S42 generated by the first to fourth detection units 10, 20, 30 and 40.

In the present embodiment, the strengths of the first to fourth partial magnetic fields MFa to MFd are different from each other. The present embodiment thus provides four pairs of corresponding ones of the first detection signals S1 and the first assumed detection values ES1, and four pairs of corresponding ones of the second detection signals S2 and the second assumed detection values ES2. They can be used to estimate the first and second unknown magnetic field information M and E by the method of least squares.

In the present embodiment, the strength $M_1$ estimated by the first strength estimation unit 251 corresponds to the strength of the component in the first direction of the magnetic field to be detected at the predetermined position, and the strength $E_1$ estimated by the first strength estimation unit 251 corresponds to the strength of the component in the first direction of the noise magnetic field Mex at the predetermined position. The strength $M_2$ estimated by the second strength estimation unit 252 corresponds to the strength of the component in the second direction of the magnetic field to be detected at the predetermined position, and the strength $E_2$ estimated by the second strength estimation unit 252 corresponds to the strength of the component in the second direction of the noise magnetic field Mex at the predetermined position. In the present embodiment, the detected angle value θs is determined on the basis of the strengths $M_1$ and $M_2$. The present embodiment thus enables estimation of the detected angle value θs with the effect of the noise magnetic field Mex eliminated. In other words, the present embodiment enables reduction of the angular error resulting from the noise magnetic field Mex.

To determine the detected angle value θs in the above-described manner, it is required to satisfy the condition that the first to fourth partial magnetic fields MFa to MFd have different strengths from each other; however, this condition introduces no substantial limitations with respect to the structure or installation of the angle sensor 1 or the angle sensor system 100. The aforementioned condition can easily be satisfied by, for example, defining the first to fourth detection positions P1 to P4 to be at different distances from the center of rotation C (see FIG. 1) in the reference plane P as in the present embodiment.

For the foregoing reasons, the present embodiment enables reduction of the angular error resulting from the noise magnetic field Mex, without introducing any substantial limitations with respect to the structure or installation of the angle sensor 1 or the angle sensor system 100.

The effects of the present embodiment will now be described with reference to simulation results. The simulation obtained the angular error AEs of a detected angle value θs that was generated in the presence of a noise magnetic field Mex having a constant direction and strength. In the simulation, the difference between the detected angle value θs and the rotating field angle θM was assumed to be the angular error AEs of the detected angle value θs.

In the simulation, as in the case of the simulation described in relation to the first embodiment, a magnetic field having a strength distribution as shown in FIG. 7 in the reference plane P was assumed as a magnetic field generated by the magnetic field generation unit 5. The strength of the noise magnetic field Mex was set at 1 mT, and the direction of the noise magnetic field Mex was set in the direction rotated by 60° from the X direction toward the Y direction.

Figure 12:
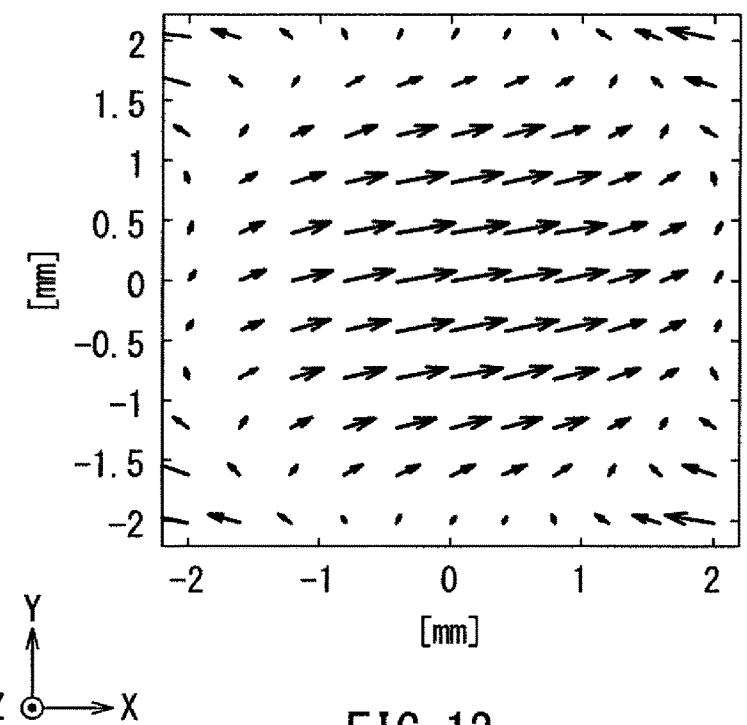
FIG. 12 is an explanatory diagram schematically illustrating the distribution of the strength and direction of a composite magnetic field in a simulation for the second embodiment of the invention.

FIG. 12 schematically illustrates the distribution of the strength and direction of a composite magnetic field in the reference plane P in the simulation. The composite magnetic field is a composite of the magnetic field generated by the magnetic field generation unit 5 and the noise magnetic field Mex. In FIG. 12, the origin point is set at the reference position, that is, the point of intersection of the reference plane P and the center of rotation C. In FIG. 12, each axis is in units of mm. In FIG. 12, each arrow represents the strength and direction of the composite magnetic field when the rotating field angle θM is 0°. The length of the arrow represents the strength of the composite magnetic field, and the direction of the arrow represents the direction of the composite magnetic field.

Figure 13:
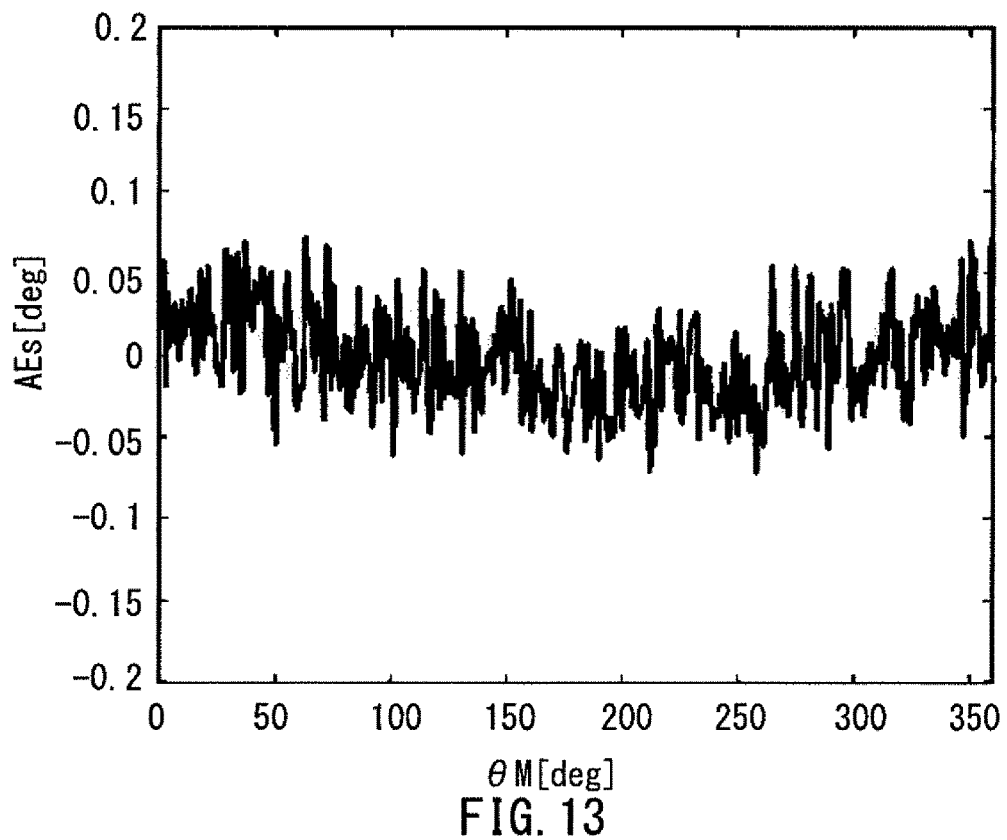
FIG. 13 is a waveform diagram illustrating an example of the waveform of an angular error obtained in the simulation for the second embodiment of the invention.

FIG. 13 is a waveform diagram illustrating an example of the angular error AEs obtained in the simulation. In FIG. 13 the horizontal axis represents the rotating field angle θM, and the vertical axis represents the value of the angular error AEs (in degrees). As shown in FIG. 13, the angular error AEs of the detected angle value θs is extremely small. The angular error AEs of the detected angle value θs results mainly from factors other than the noise magnetic field Mex. The foregoing simulation results indicate that the present embodiment enables reducing the angular error resulting from the noise magnetic field Mex.

The other configuration, function and effects of the second embodiment are the same as those of the first embodiment.

Third Embodiment

A third embodiment of the present invention will now be described. First, reference is made to FIG. 14 to describe the configuration of the angle sensor 1 according to the third embodiment. The angle sensor 1 according to the third embodiment is different from the angle sensor 1 according to the second embodiment in the following ways. The angle sensor 1 according to the third embodiment includes an angle computation unit 350 in place of the angle computation unit 250 of the second embodiment. Like the angle computation unit 250, the angle computation unit 350 generates the detected angle value θs using the method of least squares on the basis of the plurality of pairs of first and second detection signals generated at the plurality of detection units. Like the angle computation unit 250, the angle computation unit 350 assumes the first unknown magnetic field information M, the second unknown magnetic field information E, the plurality of first assumed detection values ES1, the plurality of second assumed detection values ES2, the plurality of first residuals R1, and the plurality of second residuals R2.

The angle computation unit 350 uses a plurality of composite detection signals and a plurality of composite assumed detection values. Each of the composite detection signals is a complex number representing a pair of first and second detection signals S1 and S2 generated at any one of the plurality of detection units. Each of the composite assumed detection values is a complex number representing a pair of first and second assumed detection values ES1 and ES2 corresponding to the aforementioned pair of first and second detection signals S1 and S2. As will be described later, in the present embodiment, for each of the plurality of composite detection signals, the value of the first detection signal S1 corresponds to the real part of the composite detection signal, and the value of the second detection signal S2 corresponds to the imaginary part of the composite detection signal. For each of the plurality of composite assumed detection values, the value of the first assumed detection value ES1 corresponds to the real part of the composite assumed detection value, and the value of the second assumed detection value ES2 corresponds to the imaginary part of the composite assumed detection value.

In the present embodiment, the plurality of composite assumed detection values are modeled by the following Eq. (18).

$$z = Hx \qquad (18)$$

In Eq. (18), z is an m-dimensional column vector containing m-number of elements having correspondences with the plurality of composite assumed detection values. Note that m is an integer that represents the number of the composite assumed detection values, and is equal to the number of the composite detection signals, in other words, the number of the detection units. In Eq. (18), H is a matrix with m-number of rows and two columns defined according to the patterns of the magnetic field to be detected and the noise magnetic field Mex at the plurality of detection positions. In Eq. (18), x is a 2-dimensional column vector containing the first unknown magnetic field information M and the second unknown magnetic field information E as its elements. In the present embodiment, both of the first unknown magnetic field information M and the second unknown magnetic field information E are complex numbers. The real part of the first unknown magnetic field information M, which is a complex number, corresponds to the strength $M_1$ in the second embodiment, and the imaginary part of the first unknown magnetic field information M, which is a complex number, corresponds to the strength $M_2$ in the second embodiment. The real part of the second unknown magnetic field information E, which is a complex number, corresponds to the strength $E_1$ in the second embodiment, and the imaginary part of the second unknown magnetic field information E, which is a complex number, corresponds to the strength $E_2$ in the second embodiment.

The present embodiment estimates the first unknown magnetic field information M and the second unknown magnetic field information E, which are the elements of the column vector x. Here, let y represent an m-dimensional column vector containing m-number of elements having correspondences with the plurality of composite detection signals. The elements of the column vectors y and z are complex numbers. The column vector x is estimated so as to minimize the sum of squares of the differences between the real parts of corresponding ones of the m-number of elements of the column vector y and the m-number of elements of the column vector z, and to minimize the sum of squares of the differences between the imaginary parts of corresponding ones of the m-number of elements of the column vector y and the m-number of elements of the column vector z. A concrete estimation method for the column vector x is the same as the estimation method for the column vector $x_1$ described with reference to Eqs. (7) to (9) in relation to the second embodiment. Replacing $x_1$, and $z_1$ in the description of the estimation method for the column vector $x_1$ with x, y, and z, respectively, provides a description of the estimation method for the column vector x. Eq. (19) below gives x that minimizes the value of the least squares cost function F for estimating the column vector x.

$$x = (H^T H)^{-1} H^T y \qquad (19)$$

In the present embodiment, the angle computation unit 350 determines the detected angle value θs on the basis of the first unknown magnetic field information M, in which is one of the two elements of the column vector x calculated by Eq. (19). In the present embodiment, the differences between the real parts of corresponding ones of the m-number of elements of the column vector y and the m-number of elements of the column vector z correspond to the plurality of first residuals R1, and the differences between the imaginary parts of corresponding ones of the m-number of elements of the column vector y and the m-number of elements of the column vector z correspond to the plurality of second residuals R2. Thus, the estimation method for the column vector x, which has been described with reference to Eqs. (18) and (19), corresponds to a method of estimating the first and second unknown magnetic field information M and E so as to minimize the sum of squares of the plurality of first residuals R1 and to minimize the sum of squares of the plurality of second residuals R2. In the estimation method for the column vector x, an computation to estimate the real part of each of the first and second unknown magnetic field information M and E and a computation to estimate the imaginary part of each of the first and second unknown magnetic field information M and E are performed at the same time.

Figure 14:
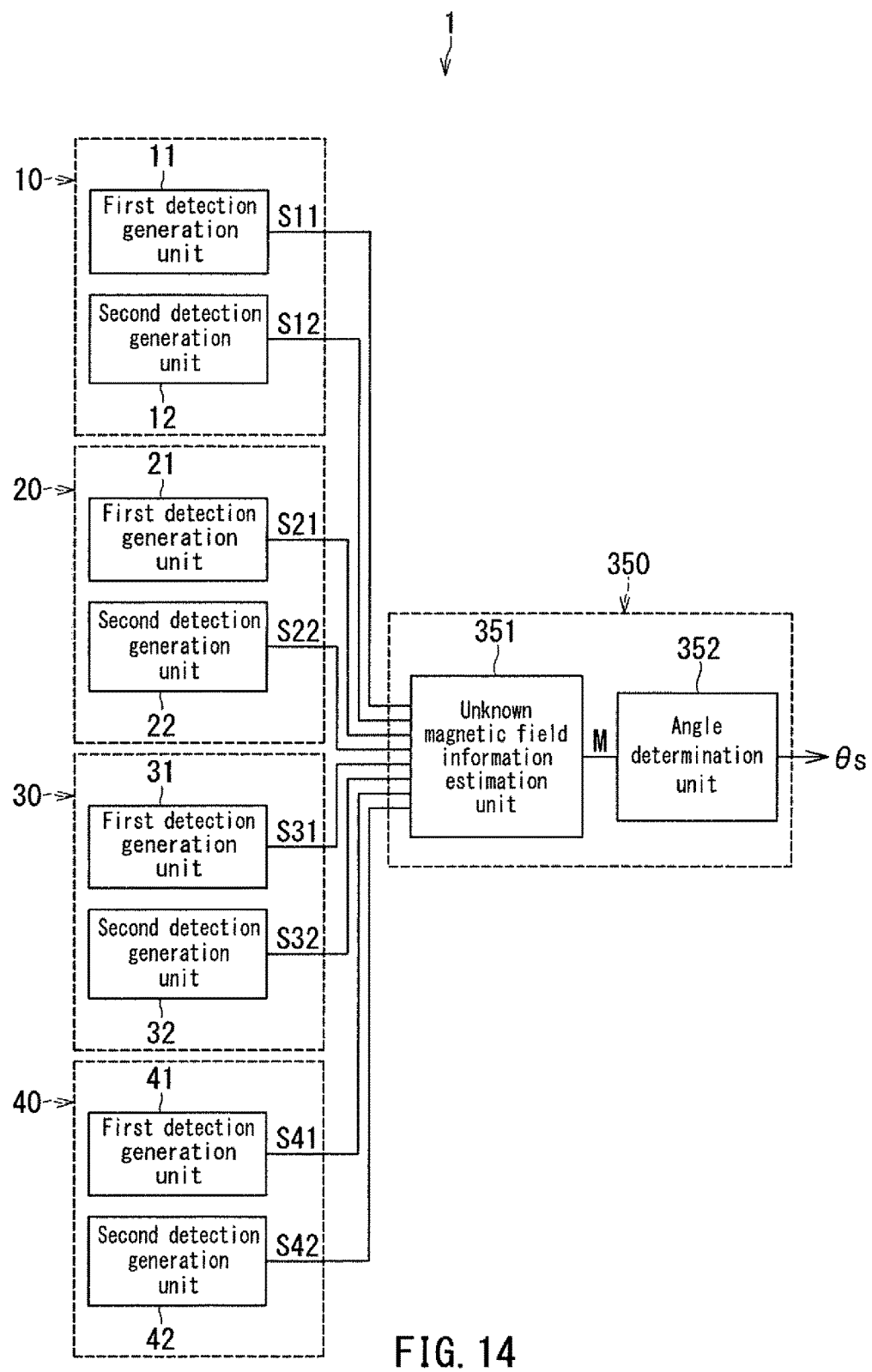
FIG. 14 is a functional block diagram illustrating the configuration of an angle sensor according to a third embodiment of the invention.

Reference is now made to FIG. 14 to specifically describe the configuration of the angle computation unit 350 and the generation method for the detected angle value θs. FIG. 14 illustrates an example configuration of the angle computation unit 350. In this example, the angle computation unit 350 includes an unknown magnetic field information estimation unit 351 and an angle determination unit 352.

Now, let ya1 represent a first one of the plurality of composite detection signals that corresponds to the first and second detection signals S11 and S12 generated at the first detection unit 10, and let ya2 represent a second one of the plurality of composite detection signals that corresponds to the first and second detection signals S21 and S22 generated at the second detection unit 20. Further, let ya3 represent a third one of the plurality of composite detection signals that corresponds to the first and second detection signals S31 and S32 generated at the third detection unit 30, and let ya4 represent a fourth one of the plurality of composite detection signals that corresponds to the first and second detection signals S41 and S42 generated at the fourth detection unit 40. All of the composite detection signals ya1 to ya4 are complex numbers. The unknown magnetic field information estimation unit 351 treats the values $y_{11}$ and $y_{12}$ of the first and second detection signals S11 and S12 as the real part and the imaginary part of the composite detection signal ya1, respectively; the values $y_{21}$ and $y_{22}$ of the first and second detection signals S21 and S22 as the real part and the imaginary part of the composite detection signal ya2, respectively; the values $y_{31}$ and $y_{32}$ of the first and second detection signals S31 and S32 as the real part and the imaginary part of the composite detection signal ya3, respectively; and the values $y_{41}$ and $y_{42}$ of the first and second detection signals S41 and S42 as the real part and the imaginary part of the composite detection signal ya4, respectively.

The unknown magnetic field information estimation unit 351 estimates the first and second unknown magnetic field information M and E using the composite detection signals ya1 to ya4. Here, let za1 represent a first one of the plurality of composite assumed detection values that corresponds to the composite detection signal ya1, and let za2 represent a second one of the plurality of composite assumed detection values that corresponds to the composite detection signal ya2. Further, let za3 represent a third one of the plurality of composite assumed detection values that corresponds to the composite detection signal ya3, and let za4 represent a fourth one of the plurality of composite assumed detection values that corresponds to the composite detection signal ya4. The composite assumed detection values za1 to za4 are all complex numbers.

The real part of the composite assumed detection value za1 represents a first one of the plurality of first assumed detection values ES1 that corresponds to the first detection signal S11, and the imaginary part of the composite assumed detection value za1 represents a first one of the plurality of second assumed detection values ES2 that corresponds to the second detection signal S12. The real part of the composite assumed detection value za2 represents a second one of the plurality of first assumed detection values ES1 that corresponds to the first detection signal S21, and the imaginary part of the composite assumed detection value za2 represents a second one of the plurality of second assumed detection values ES2 that corresponds to the second detection signal S22. The real part of the composite assumed detection value za3 represents a third one of the plurality of first assumed detection values ES1 that corresponds to the first detection signal S31, and the imaginary part of the composite assumed detection value za3 represents a third one of the plurality of second assumed detection values ES2 that corresponds to the second detection signal S32. The real part of the composite assumed detection value za4 represents a fourth one of the plurality of first assumed detection values ES1 that corresponds to the first detection signal S41, and the imaginary part of the composite assumed detection value za4 represents a fourth one of the plurality of second assumed detection value ES2 that corresponds to the second detection signal S42.

In the present embodiment, the composite assumed detection values za1, za2, za3 and za4 are modeled by the following Eq. (20).

$$\begin{bmatrix} za1 \\ za2 \\ za3 \\ za4 \end{bmatrix} = \begin{bmatrix} Amp_1 & 1 \\ Amp_2 & 1 \\ Amp_3 & 1 \\ Amp_4 & 1 \end{bmatrix} \begin{bmatrix} M \\ E \end{bmatrix} \quad (20)$$

The four-dimensional column vector on the left side of Eq. (20) corresponds to z of Eq. (18). The matrix with four rows and two columns on the right side of Eq. (20) corresponds to H of Eq. (18). This matrix is the same as the matrix Hc of the second embodiment.

The two-dimensional column vector on the right side of Eq. (20) corresponds to x of Eq. (18). This column vector is hereinafter represented by xac. The column vector xac contains the first unknown magnetic field information M and the second unknown magnetic field information E as its elements. As previously mentioned, in the present embodiment both of the first unknown magnetic field information M and the second unknown magnetic field information E are complex numbers. The argument of the first unknown magnetic field information M corresponds to direction information corresponding to the detected angle value θs. The absolute value of the first unknown magnetic field information M corresponds to magnitude information corresponding to the strength of the magnetic field to be detected at a predetermined position. In the present embodiment, the predetermined position is the reference position mentioned previously. The argument of the second unknown magnetic field information E corresponds to direction information corresponding to the direction of the noise magnetic field Mex. The absolute value of the second unknown magnetic field information E corresponds to magnitude information corresponding to the strength of the noise magnetic field Mex.

The unknown magnetic field estimation unit 351 estimates the column vector xac on the basis of Eq. (19). Here, let yac represent a four-dimensional column vector containing the composite detection signals ya1 to ya4 as its elements. The column vector yac is represented by the following Eq. (21).

$$yac^T = [ya1, ya2, ya3, ya4] \quad (21)$$

The unknown magnetic field information estimation unit 351 calculates xac using an equation replacing H, x, and y in Eq. (19) with Hc, xac, and yac, respectively. The first unknown magnetic field information M and the second unknown magnetic field information E are thereby estimated.

The angle determination unit 352 determines the detected angle value θs on the basis of the first unknown magnetic field information M estimated by the unknown magnetic field estimation unit 351. In the present embodiment, the argument of the estimated first unknown magnetic field information M is determined as the detected angle value θs. The angle determination unit 352 thus calculates the detected angle value θs by obtaining the argument of the estimated first unknown magnetic field information M. To be more specific, the angle determination unit 352 calculates θs by the following Eq. (22) using the strengths $M_1$ and $M_2$, which are the real part and the imaginary part of the estimated first unknown magnetic field information M, respectively.

$$\theta s = a\tan(M_2/M_1) \quad (22)$$

For θs within the range of 0° to less than 360°, Eq. (22) yields two solutions that are 180° different in value. Which of the two solutions for θs in Eq. (22) is the true value of θs can be determined from the combination of positive and negative signs of $M_1$ and $M_2$. The angle determination unit 352 obtains θs within the range of 0° to less than 360° using Eq. (22) and on the basis of the foregoing determination on the combination of positive and negative signs of $M_1$ and $M_2$.

The other configuration, function and effects of the third embodiment are the same as those of the second embodiment.

The present invention is not limited to the foregoing embodiments, and various modifications may be made thereto. For example, as far as the requirements of the appended claims are met, the numbers and layouts of the plurality of detection positions and the plurality of detection units can be freely chosen without being limited to the examples illustrated in the foregoing embodiments. The distribution of the strength of the magnetic field to be detected, and the positional relationship between the magnetic field generation unit and the plurality of detection positions are not specifically limited as long as the magnetic field to be detected has different strengths at the plurality of detection positions.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. An angle sensor for generating a detected angle value having a correspondence with an angle to be detected, comprising:
    a plurality of detection units for detecting, at a plurality of detection positions different from each other, a composite magnetic field of a magnetic field to be detected and a noise magnetic field other than the magnetic field to be detected; and
    an angle computation unit for generating the detected angle value, wherein
    at each of the plurality of detection positions, the magnetic field to be detected varies in direction according to the angle to be detected,
    the magnetic field to be detected has different strengths at the plurality of detection positions,
    each of the plurality of detection units includes a first detection signal generation unit for generating a first detection signal representing the strength of a component in a first direction of the composite magnetic field, and a second detection signal generation unit for generating a second detection signal representing the strength of a component in a second direction of the composite magnetic field, and
    the angle computation unit generates the detected angle value by performing computations using a plurality of pairs of first and second detection signals generated at the plurality of detection units so that an error of the detected angle value resulting from the noise magnetic field is made smaller than in the case of generating the detected angle value on the basis of only a pair of first and second detection signals generated at any one of the plurality of detection units.

2. The angle sensor according to claim 1, wherein the first direction and the second direction are orthogonal to each other.

3. The angle sensor according to claim 1, wherein each of the first and second detection signal generation units includes at least one magnetic detection element.

4. The angle sensor according to claim 1, wherein
    the plurality of detection units are a first detection unit and a second detection unit, and
    the angle computation unit generates the detected angle value using a difference between the first detection signal generated at the first detection unit and the first detection signal generated at the second detection unit, and a difference between the second detection signal generated at the first detection unit and the second detection signal generated at the second detection unit.

5. The angle sensor according to claim 1, wherein the angle computation unit generates the detected angle value using a method of least squares on the basis of the plurality of pairs of first and second detection signals.

6. The angle sensor according to claim 5, wherein
    the angle computation unit assumes first unknown magnetic field information, second unknown magnetic field information, a plurality of first assumed detection values, a plurality of second assumed detection values, a plurality of first residuals, and a plurality of second residuals,
    the first unknown magnetic field information corresponds to strengths, at a predetermined position, of a component in the first direction and a component in the second direction of the magnetic field to be detected,
    the second unknown magnetic field information corresponds to strengths of a component in the first direction and a component in the second direction of the noise magnetic field,
    each of the plurality of first assumed detection values is a value that corresponds to one of the first detection signals generated at the plurality of detection units and is assumed on the basis of the first and second unknown magnetic field information,
    each of the plurality of second assumed detection values is a value that corresponds to one of the second detection signals generated at the plurality of detection units and is assumed on the basis of the first and second unknown magnetic field information,
    each of the plurality of first residuals is a difference between one of the first detection signals generated at the plurality of detection units and a corresponding one of the first assumed detection values,
    each of the plurality of second residuals is a difference between one of the second detection signals generated at the plurality of detection units and a corresponding one of the second assumed detection values, and
    the angle computation unit estimates the first and second unknown magnetic field information so as to minimize the sum of squares of the plurality of first residuals and to minimize the sum of squares of the plurality of second residuals, and determines the detected angle value on the basis of the estimated first unknown magnetic field information.

7. The angle sensor according to claim 6, wherein the angle computation unit performs computations to determine the detected angle value using a plurality of composite detection signals and a plurality of composite assumed detection values, each of the plurality of composite detection signals being a complex number representing a pair of first and second detection signals generated at one of the plurality of detection units, each of the plurality of composite assumed detection values being a complex number representing a pair of first and second assumed detection values corresponding to the pair of first and second detection signals.

8. An angle sensor system comprising:
    the angle sensor according to claim 1; and
    a magnetic field generation unit for generating the magnetic field to be detected.

* * * * *